(12) United States Patent
Ndip

(10) Patent No.: US 10,490,524 B2
(45) Date of Patent: Nov. 26, 2019

(54) ANTENNA APPARATUS HAVING BOND WIRES

(71) Applicant: Fraunhofer-Gesellschaft zur Foerderung der angewandten Forschung e.V., Munich (DE)

(72) Inventor: Ivan Ndip, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 31 days.

(21) Appl. No.: 15/863,511

(22) Filed: Jan. 5, 2018

(65) Prior Publication Data

US 2018/0190612 A1   Jul. 5, 2018

(30) Foreign Application Priority Data

Jan. 5, 2017   (DE) .................. 10 2017 200 132

(51) Int. Cl.
*H01Q 1/44* (2006.01)
*H01L 23/00* (2006.01)
(Continued)

(52) U.S. Cl.
CPC .............. *H01L 24/48* (2013.01); *H01L 23/13* (2013.01); *H01L 23/3121* (2013.01); *H01L 23/49838* (2013.01); *H01L 23/66* (2013.01); *H01L 24/49* (2013.01); *H01P 3/08* (2013.01); *H01Q 1/2283* (2013.01); *H01Q 1/44* (2013.01); *H01Q 15/02* (2013.01); *H01Q 19/10* (2013.01); *H01Q 21/0025* (2013.01); *H01L 2223/6611* (2013.01);
(Continued)

(58) Field of Classification Search
CPC .......... H01Q 1/44; H01Q 15/02; H01Q 19/10; H01Q 21/0025; H01Q 9/42
See application file for complete search history.

(56) References Cited

U.S. PATENT DOCUMENTS 7,295,161 B2   11/2007   Gaucher et al.
7,580,001 B2   8/2009   Tsai et al.
(Continued)

FOREIGN PATENT DOCUMENTS

WO   0021030 A1   4/2000
WO   0065691 A1   11/2000
(Continued)

*Primary Examiner* — Graham P Smith
(74) *Attorney, Agent, or Firm* — Michael A. Glenn; Perkins Coie LLP

(57) ABSTRACT

An antenna apparatus includes a radio-frequency chip arranged on a substrate, wherein the radio-frequency chip includes at least one antenna output terminal and the antenna output terminal functions as a first fixing region for an electric conductor. The antenna apparatus further includes a first bond wire connecting in an electrically conducting manner the first fixing region to a second fixing region arranged on the substrate. Furthermore, the antenna apparatus includes a second bond wire connecting in an electrically conducting manner the second fixing region and a third fixing region arranged on the substrate. According to the invention, the first and the second bond wire electrically connected in series form an antenna. In this case, the first and second bond wires are at least regionally spaced apart from the substrate.

36 Claims, 18 Drawing Sheets

(51) Int. Cl.
  *H01L 23/498* (2006.01)
  *H01L 23/13* (2006.01)
  *H01P 3/08* (2006.01)
  *H01L 23/31* (2006.01)
  *H01Q 1/22* (2006.01)
  *H01Q 19/10* (2006.01)
  *H01Q 15/02* (2006.01)
  *H01Q 21/00* (2006.01)
  *H01L 23/66* (2006.01)
  *H01Q 1/52* (2006.01)
  *H01Q 9/42* (2006.01)

(52) U.S. Cl.
  CPC ............ *H01L 2223/6627* (2013.01); *H01L 2223/6677* (2013.01); *H01L 2224/48091* (2013.01); *H01L 2224/48106* (2013.01); *H01L 2224/48108* (2013.01); *H01L 2224/48227* (2013.01); *H01L 2224/49175* (2013.01); *H01L 2924/1421* (2013.01); *H01L 2924/15153* (2013.01); *H01L 2924/19031* (2013.01); *H01Q 1/523* (2013.01); *H01Q 9/42* (2013.01)

(56) References Cited

U.S. PATENT DOCUMENTS

| | | |
|---|---|---|
| 7,586,193 B2 | 9/2009 | Weste |
| 7,768,456 B2 | 8/2010 | Tsutsumi et al. |
| 8,599,092 B2 | 12/2013 | Washiro |
| 2006/0028378 A1 | 2/2006 | Gaucher et al. |
| 2007/0170560 A1 | 7/2007 | Gaucher et al. |
| 2008/0205495 A1 | 8/2008 | Trott |
| 2008/0291107 A1 | 11/2008 | Tsai et al. |
| 2014/0138446 A1 | 5/2014 | Wu et al. |
| 2014/0253391 A1 | 9/2014 | Yen |
| 2014/0325150 A1* | 10/2014 | Hashimoto ........... H01L 23/552 711/115 |

FOREIGN PATENT DOCUMENTS

| | | |
|---|---|---|
| WO | 2011025241 A2 | 3/2011 |
| WO | 2014049088 A1 | 4/2014 |
| WO | 2014088210 A1 | 6/2014 |

* cited by examiner

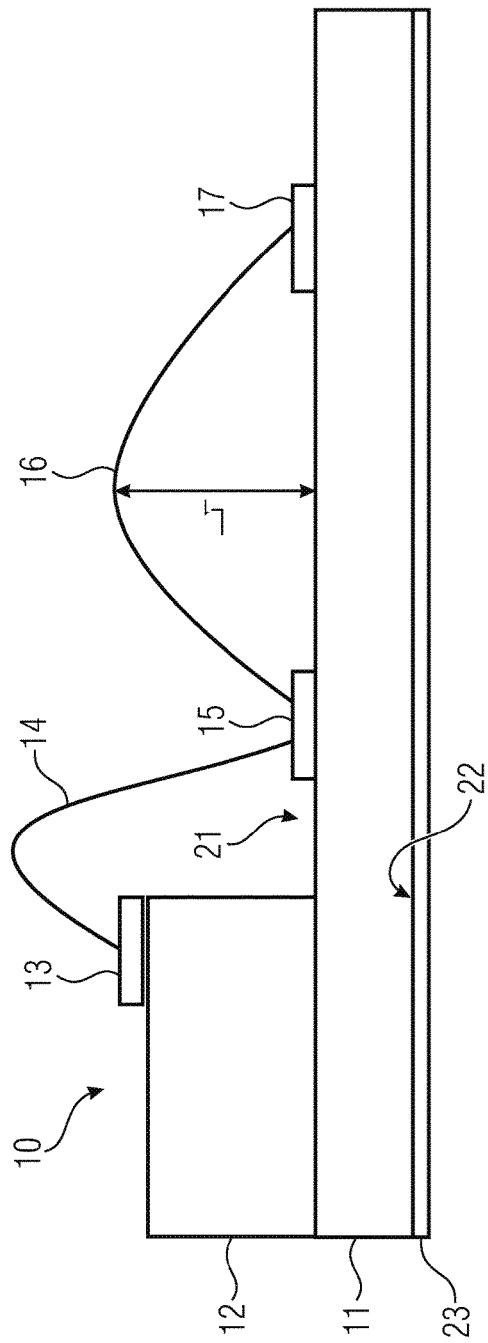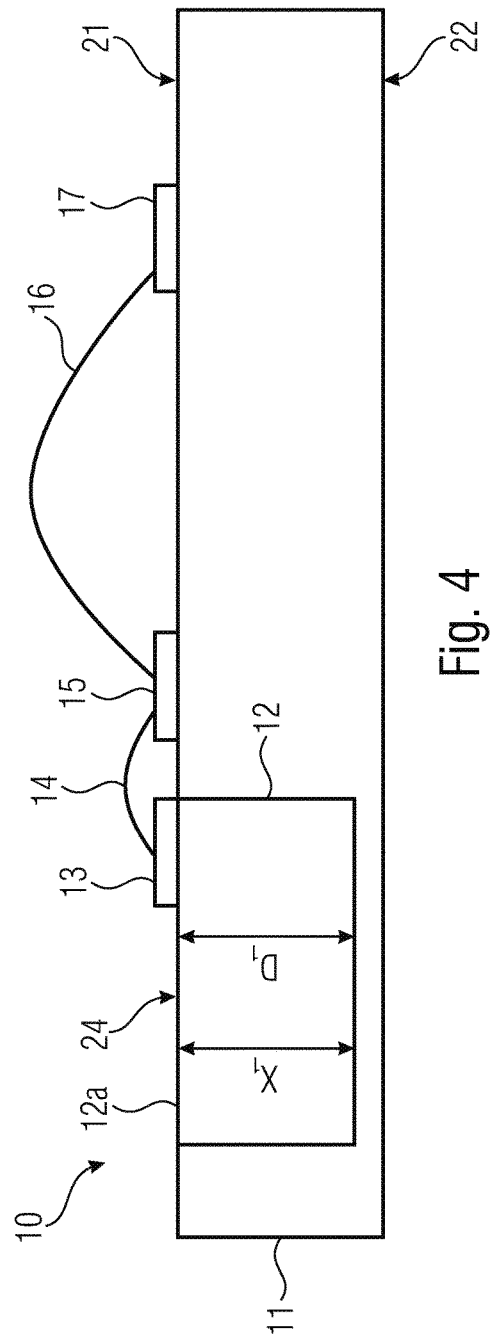

ANTENNA APPARATUS HAVING BOND WIRES

CROSS-REFERENCE TO RELATED APPLICATION

This application claims priority from German Patent Application No. DE 10 2017 200 132.1, which was filed on Jan. 5, 2017, and is incorporated herein in its entirety by reference.

BACKGROUND OF THE INVENTION

The invention concerns an antenna apparatus and an antenna array comprising at least one antenna apparatus.

In the semiconductor technology and/or the microsystem technology, thin wires are used for connecting and electrically contacting integrated circuits to other electric structures. The method used in this case is also referred to as wire bonding and the thin wires used are accordingly also referred to as bond wires. Thus, these bond wires mainly serve for creating a galvanic connection between two electrically conductive structures.

For example, integrated circuits (IC) may be galvanically connected by means of bond wires to structures at a substrate carrying the IC. With respect to integrated circuits, e.g., radio-frequency microchips which comprise antenna ports for linking antennas are known. The antenna ports form terminal regions for antennas and, at the same time, signal outputs by means of which a signal to be transmitted may be transmitted to the antenna linked thereto.

In this case, it is known to use bond wires as radiators, or antennas. For example, a bond wire connecting an antenna port of a microchip to an electrically terminating structure on a carrier substrate carrying the microchip forms an antenna. This type of antennas is also referred to as a bond wire antenna.

For example, such a bond wire antenna is described in US 2008/0291107 A1. Herein, an RF chip is connected to a bond pad on the substrate by means of bond wires. The RF chip comprises a differential antenna terminal, i.e., two antenna ports, a respective bond wire being linked to each respective antenna port. Furthermore, it is described that the two bond pads may be connected to an electrically conductive path on the substrate in order to realize a folded dipole structure. Due to the two differential antenna ports, the region forming the termination of the antenna is located on the chip in the antenna structure described in this Reference.

U.S. Pat. No. 7,768,456 B2 shows a similar structure. In this case, two bond wires linked to two differential antenna ports of the chip are also routed to bond pads arranged on the substrate. The two bond pads are also connected to each other by means of an electric conductor. This reference describes that a metallic plate is to be used for this connection. In order to ensure between the two bond pads a current flow as direct, or linear, as possible, the width of the metallic plate should be larger than the diameter of the bond wires.

Known RF chips usually comprise only two (differential) antenna ports so that a maximum of two bond wires may be used as antenna. FIG. 1A shows such a pin assignment of a known chip 1. The chip 1 comprises a first antenna port 2 and a second antenna port 3.

FIG. 1B shows a further example of the conventional technology. In this case, an above-mentioned chip 1 is arranged on a substrate 4. The substrate 4 comprises a first bond pad 5 and a second bond pad 6. A first bond wire 7 connects the first antenna port 2 of the chip 1 to the first bond pad 5. A second bond wire 8 connects the second antenna port 3 of the chip 1 to the second bond pad 6.

The above-mentioned known bond wire antennas have the advantage that the bond wires used for galvanically connecting may simultaneously be used a radiators or as antenna. Thus, separate antenna structures may be omitted.

However, it is difficult to adjust the antennas. This is especially the case for radio signals in the radio-frequency range having a wavelength in the millimeter range. Here, fluctuations of the antenna length in the range of a few millimeters or micrometers already lead to large deviations in the radiation performance of the antenna.

In principle, the wavelength of the radio signal to be emitted with the bond wire antenna is determined, among other things, by the length of the antenna, i.e., by the length of the bond wire stretched between the RF chip and the bond pad on the substrate. Usually, the bond pads are positioned on the substrate at defined locations of the substrate. The antenna ports at the RF chip are also positioned at defined locations of the chip. Thus, the distances between the antenna ports on the chip and the bond pads on the substrate are predefined and, furthermore, may significantly vary depending on the chip manufacturer or the substrate manufacturer, respectively. Additionally, during the chip bonding of the RF chip onto the substrate, deviations in the relative positioning with respect to each other may also occur, i.e., the manufactured chip-substrate arrangements are usually not one hundred percent identical to each other.

This means that tuning the length of the bond wire is subject to certain restrictions resulting from the above-mentioned positions of the bond pads relative to the antenna ports. For example, the bond wire has to invariably have a certain minimum length in order to be able to connect the antenna port with the bond pad on the substrate. However, this mechanically predefined minimum length of the bond wire does not have to match the length of the bond wire desired for tuning the bond wire antenna. Therefore, the length of the bond wire may not simply be adjusted to the desired wavelength of the radio signal without having to observe the given (e.g. mechanical) restrictions (e.g. minimum length).

On the other hand, a bond wire may not be arbitrarily long. Due to its very thin diameter, a bond wire tends to break with increasing length.

In practice, this makes it difficult to adjust the known bond wire antennas exactly to the desired wavelength of the radio signal to be emitted. Actually, an individual bond wire would have to be configured for each substrate-chip arrangement in this case. However, this would lead to unprofitable production costs. For this reason, the currently known machine-manufactured bond wire antennas sometimes have large fluctuations with respect to radiation characteristic, e.g., with respect to their antenna gain.

SUMMARY

According to an embodiment, an antenna apparatus may have: a radio-frequency chip arranged on a substrate, wherein the radio-frequency chip has at least one antenna output terminal, wherein the antenna output terminal functions as a first fixing region for an electric conductor, at least one first bond wire connecting in an electrically conducting manner the first fixing region to a second fixing region arranged on the substrate, at least one second bond wire connecting in an electrically conducting manner the second fixing region and a third fixing region arranged on the substrate, wherein the first and the second bond wire electrically connected in series form an antenna, and wherein the first and the second bond wire are at least regionally spaced apart from the substrate.

According to another embodiment, an antenna apparatus may have: a substrate having a first main side and a second main side arranged opposite thereto; a first, a second and a third fixing region arranged at the first main side for fixing electric conductors; at least one first bond wire connecting the first fixing region and the second fixing region, which is at least regionally spaced apart from the substrate; at least one second bond wire connecting the second fixing region and the third fixing region, which is at least regionally spaced apart from the substrate; and a metallization arranged at the second main side of the substrate, which is arranged opposite to at least one of the first fixing region, the second fixing region, the third fixing region, the first bond wire and the second bond wire.

According to another embodiment, an antenna array having at least one inventive antenna apparatus may have at least one third bond wire connecting a fourth and a fifth fixing region arranged on the first main side of the substrate, and further having at least one fourth bond wire connecting a sixth and a seventh fixing region arranged on the first main side of the substrate.

The antenna apparatus according to the invention includes a first fixing region on the RF chip and a second fixing region on the substrate. A first bond wire mechanically and galvanically connects the first and second fixing regions. Compared to known bond wire antennas, the antenna apparatus according to the invention comprises a third fixing region on the substrate, and a second bond wire mechanically and galvanically connects the second and third fixing regions. Thus, this creates a series connection of the two bond wires. The two bond wires connected in series may be used as a mutual bond wire antenna, the third fixing region forming a termination of the antenna. The wavelength of the radio signal emitted by means of this bond wire antenna is affected, among other things, by the sum of the geometrical lengths of the two bond wires. Thus, the first bond wire connecting the RF chip and the substrate may be appropriately selected in order to fulfill the above-mentioned predefined restrictions. On the other hand, the length of the second bond wire may at the same time be appropriately selected in order to adjust the antenna. Compared to the conventional technology, this makes it a lot easier to adjust the geometrical length of the antenna to a certain wavelength range, since the length of the second bond wire may be selected significantly more freely than compared to the first bond wire. Furthermore, using the present invention, the danger of a wire break may be avoided since two individual bond wires may be used instead of one single long bond wire in order to achieve the same length in sum. Furthermore, the antenna apparatus according to the invention may be advantageously used to realize different antenna configurations in the simplest manner.

The antenna apparatus according to claim 21 comprises a substrate having arranged thereon the above-mentioned series connection of the two bond wires including the three fixing regions. Thus, the antenna apparatus according to the invention may also be manufactured without a RF chip, and may be separately connected to an RF chip. The substrate comprises a first main side and a second main side arranged opposite thereto, as well as a first, a second and a third fixing region arranged at the first main side for fixing electric conductors. Thus, compared to the above-mentioned antenna apparatus according to claim 1, in the antenna apparatus according to claim 21, the first fixing region is arranged on the substrate. In this case, the first fixing region may serve for a signal supply for the first and the second bond wire. In order to ensure a return of the power fed, the substrate according to claim 21 comprises a metallization arranged at the second main side. Apart from this, the antenna apparatus according to claim 21 has the same advantages as the above-mentioned antenna apparatus according to claim 1 and, therefore, also solves the technical object the invention is based on.

BRIEF DESCRIPTION OF THE DRAWINGS

Embodiments of the present invention will be detailed subsequently referring to the appended drawings, in which:

FIG. 3 shows a side view of the antenna apparatus of FIG. 2A, FIG. 4 shows a side view of an inventive antenna apparatus according to an embodiment.

DETAILED DESCRIPTION OF THE INVENTION

Figure 1A:
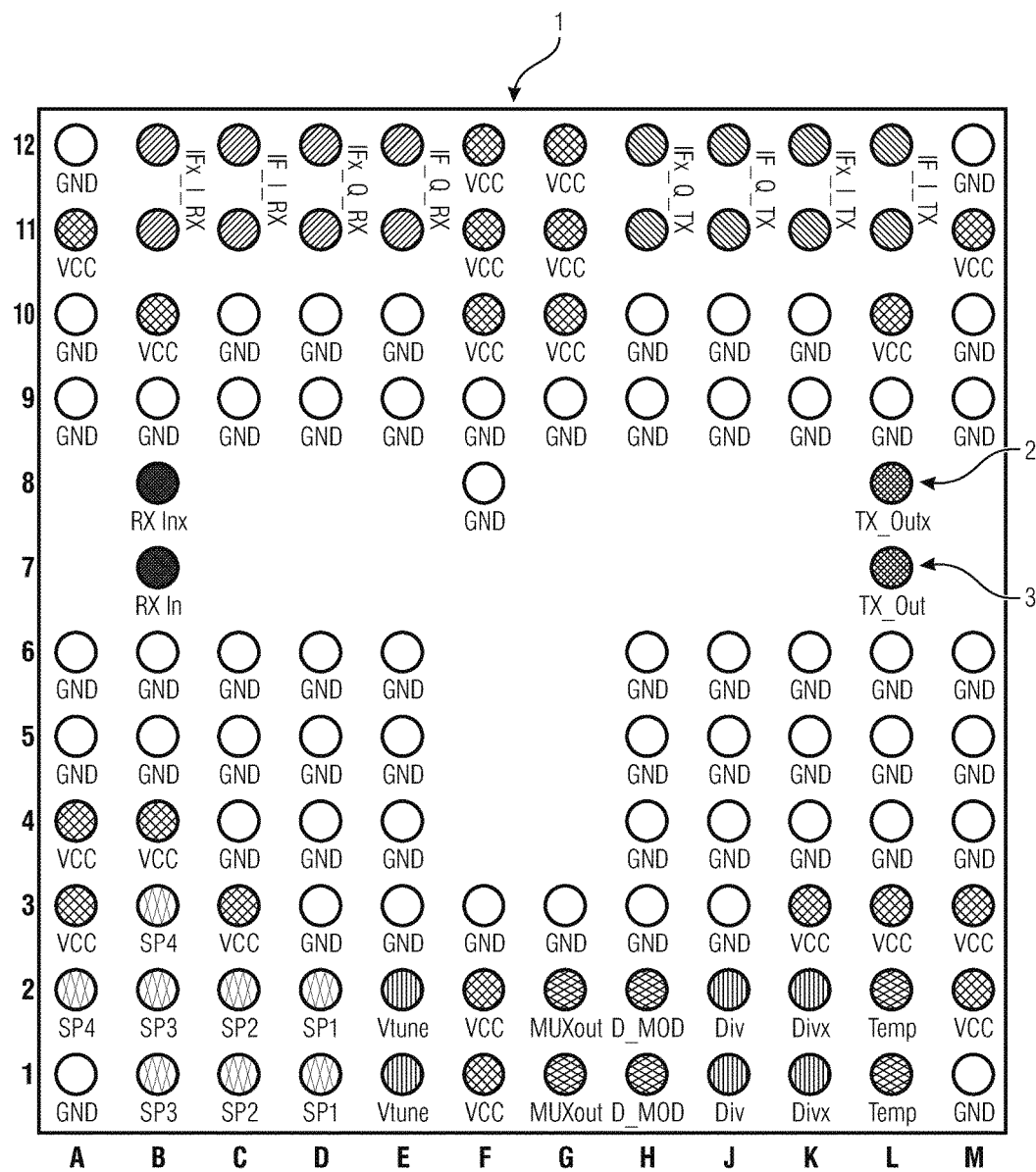
FIG. 1A shows a top view of a pin assignment of a chip known from the conventional technology.
Figure 1B:
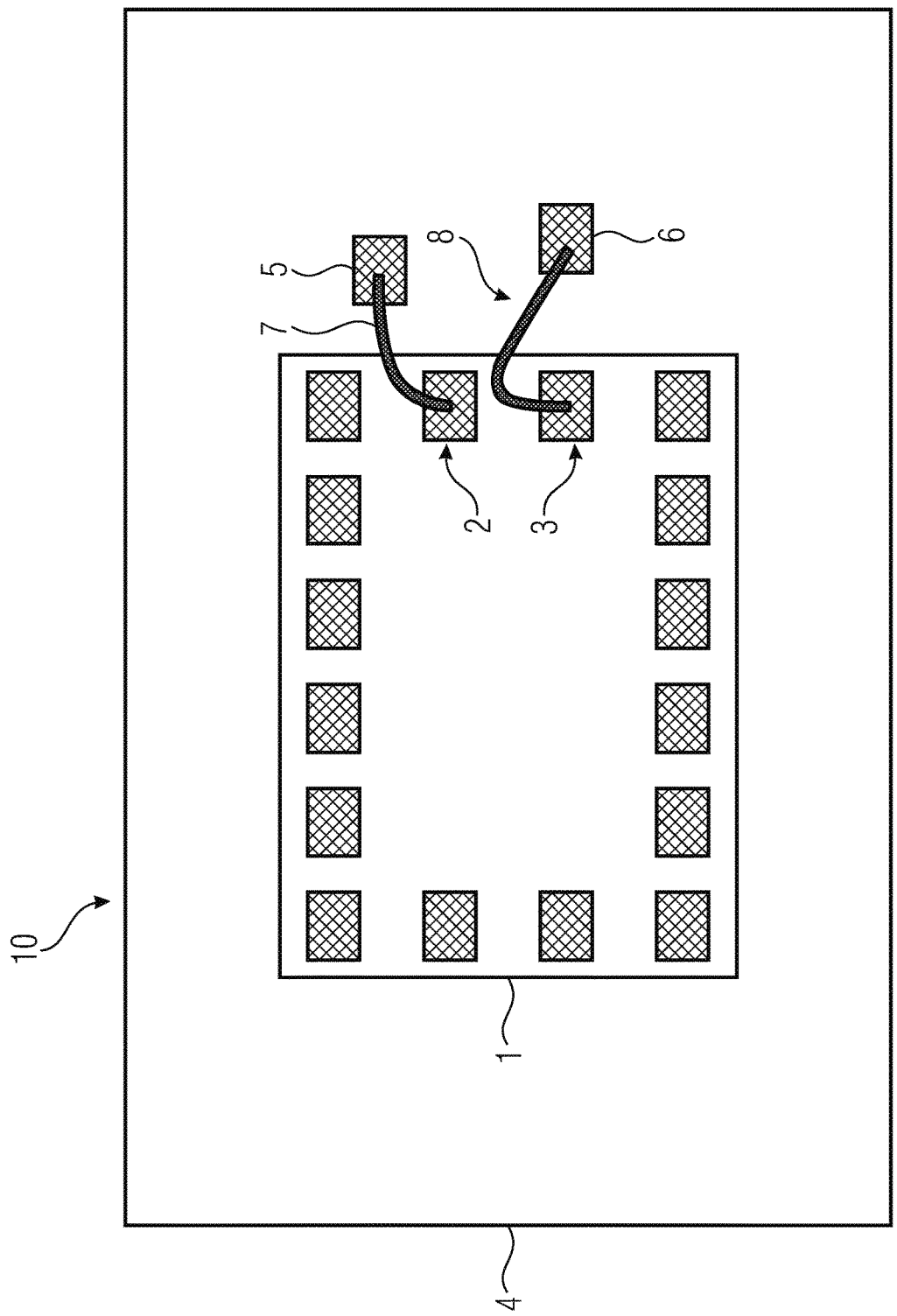
FIG. 1B shows a top view of a substrate having a chip and two bond wires connecting the chip to the substrate according to the conventional technology.

In the following, embodiments of the invention are described in detail with reference to the figures, wherein elements having the same or similar functions are provided with the same reference numerals. Furthermore, the features of the invention are first described in a structural manner with reference to the figures. Subsequently, the function of the invention is described.

Figure 2A:
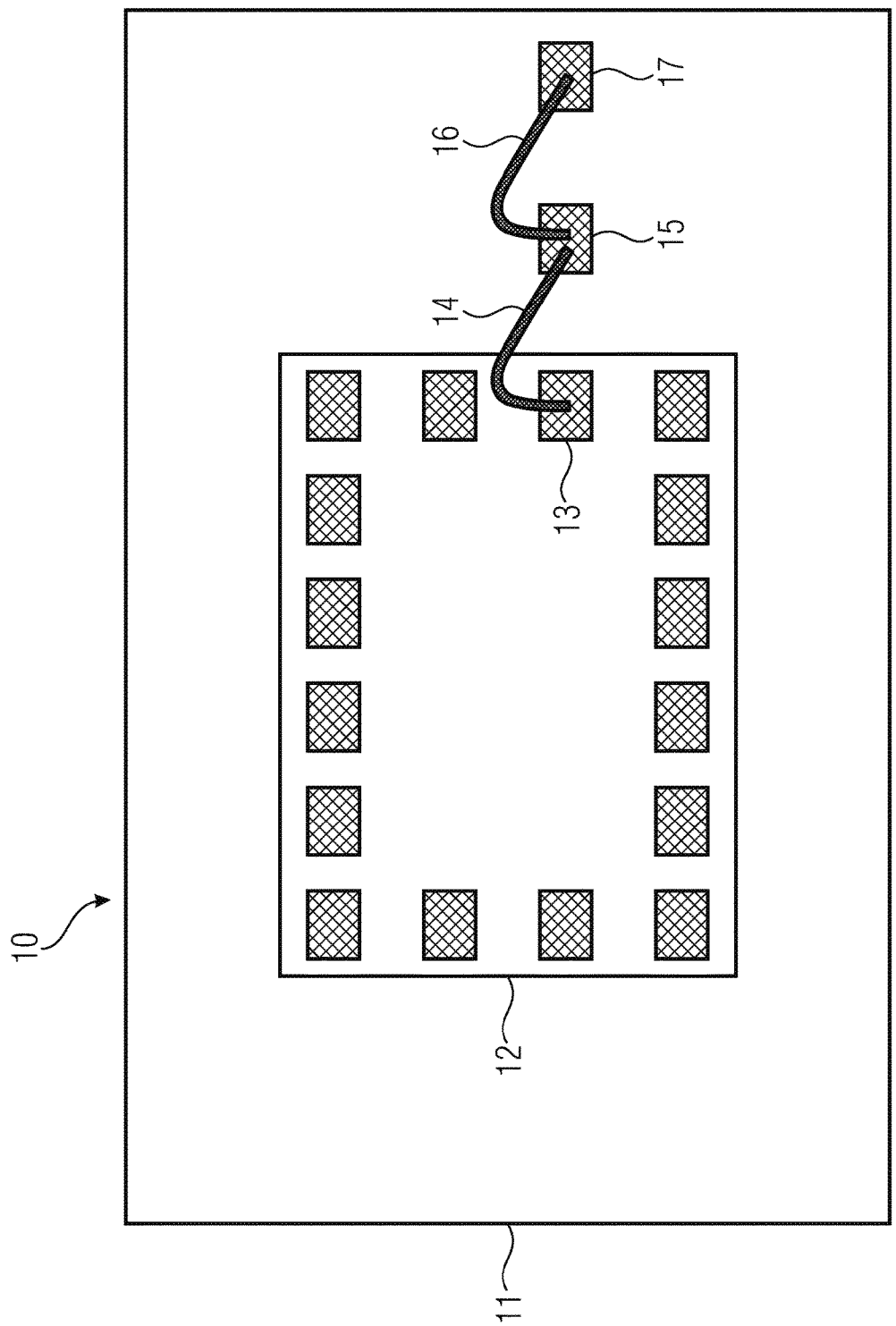
FIG. 2A shows a top view of an inventive antenna apparatus according to an embodiment.
Figure 2B:
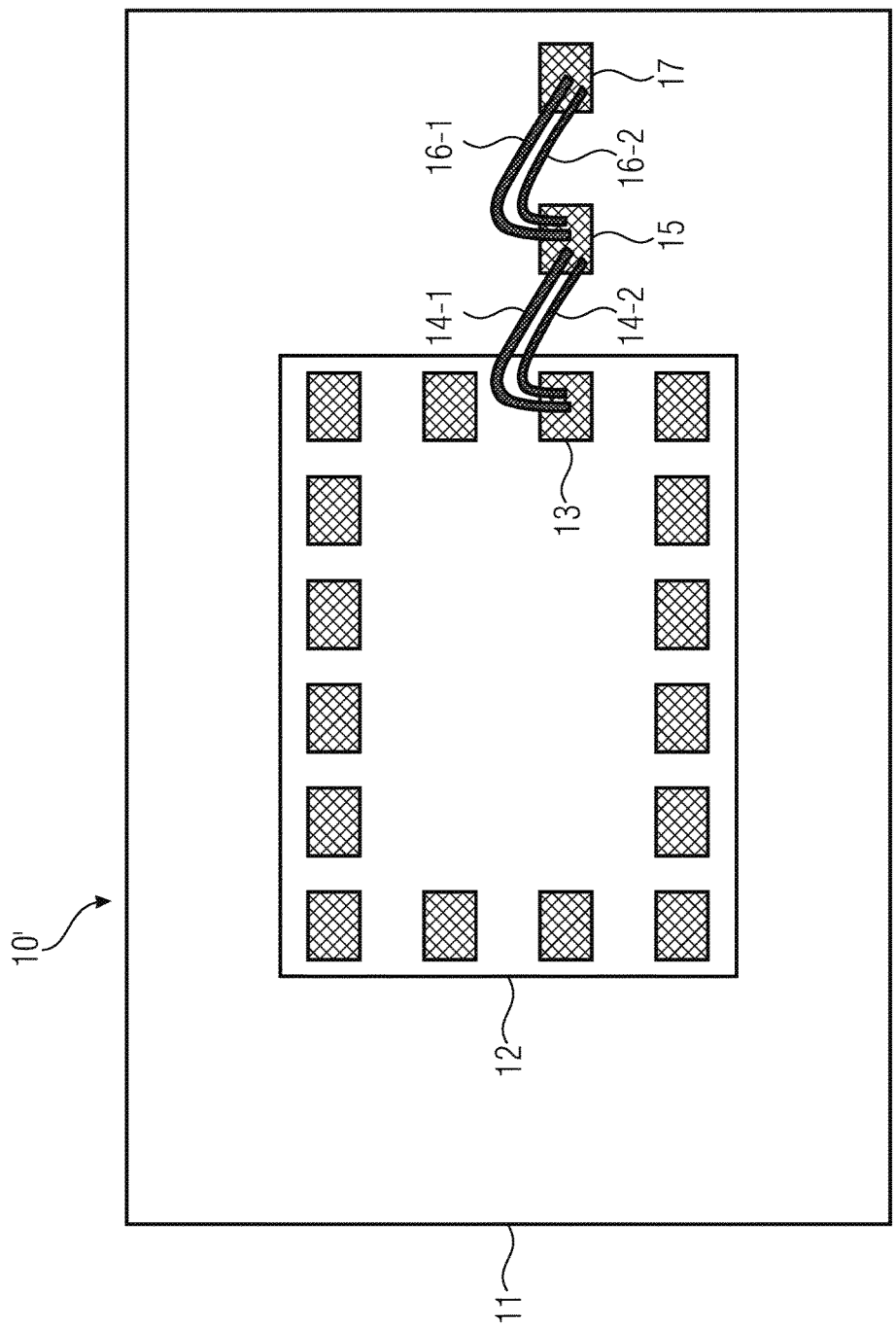
FIG. 2B shows a top view of a further inventive antenna apparatus according to an embodiment.

FIGS. 2A, 2B and 3 show an inventive antenna apparatus 10 according to a first embodiment. The antenna apparatus 10 comprises, among other things, a radio-frequency chip 12 arranged on a substrate 11, wherein the radio-frequency chip 12 comprises at least one antenna output terminal 13. The antenna output terminal 13 serves as a first fixing region for an electric conductor.

Furthermore, the antenna apparatus 10 comprises a first bond wire 14 connecting in an electrically conducting manner the antenna output terminal 13 to a second fixing region 15 arranged on the substrate 11.

The antenna apparatus 10 further comprises a second bond wire 16 connecting in an electrically connecting manner the second fixing region 15 and a third fixing region 17 arranged on the substrate 11.

According to the invention, the first and the second bond wire 14, 16 connected in series both form an antenna, in particular a bond wire antenna.

Furthermore, the first and the second bond wire 14, 16 are at least regionally spaced apart from the substrate 11. For example, it is shown in FIG. 3 that the second bond wire 16 is spaced apart from the substrate 11 in the vertical direction by a dimension $L_1$ at a location of the largest distance.

An electric signal may be applied to the first fixing region 13, the second fixing region 15 or the third fixing region 17. For example, the electric signal may be a radio-frequency signal. In connection with the embodiments described herein, a high-frequency signal is understood to be a signal with a frequency of at least 150 kHz. Advantageously, the electric signal comprises a frequency of at least 1 MHz and may particularly advantageously be used for generating so-called microwaves, millimeter waves or terahertz, which comprise a frequency in a frequency band of at least 30 GHz and up to 300 GHz. Other frequency ranges may also be realized. Millimeter waves are understood to be wavelengths in a range of at least 1 mm and up to 10 mm, which correspond to a frequency of the electric signal via the correlation $\lambda=c/f$.

According to a conceivable implementation, the radio-frequency chip 12 is arranged on a first main side 21 of the substrate 11, and a metallization 23 is arranged at the substrate 11 on a second main side 22 of the substrate 11 opposite to the first main side 21, e.g., as shown in FIG. 3.

According to a further conceivable implementation, as exemplarily illustrated in FIG. 4, the substrate 11 comprises on the first main side 21 a recess 24 extending in a direction of the second main side 22. The radio-frequency chip 12 is arranged in this recess 24.

According to an embodiment, the depth $X_1$ of the recess 24 corresponds to the thickness $D_1$ of the radio-frequency chip 12 so that the top side 12a of the radio-frequency chip 12 is coplanar to the first main side 21 on the substrate 11 when the radio-frequency chip 12 is arranged in the recess 24. With this, the distance between the first fixing region 13 on the chip 12 and the second fixing region 15 on the substrate 11 may be decreased so that, compared to an implementation, e.g., as shown in FIG. 3, the length of the first bond wire 14 may be decreased accordingly.

As illustrated for the antenna apparatus 10 in detail based on FIG. 2B, in some embodiments, two or more bond wires 14-1 and 14-2 or 16-1 and 16-2 are connected in parallel between two fixing regions 13 and 15, and 15 and 17, respectively, enabling a high performance or radiation efficiency of the antenna apparatus 10'.

Figure 5:
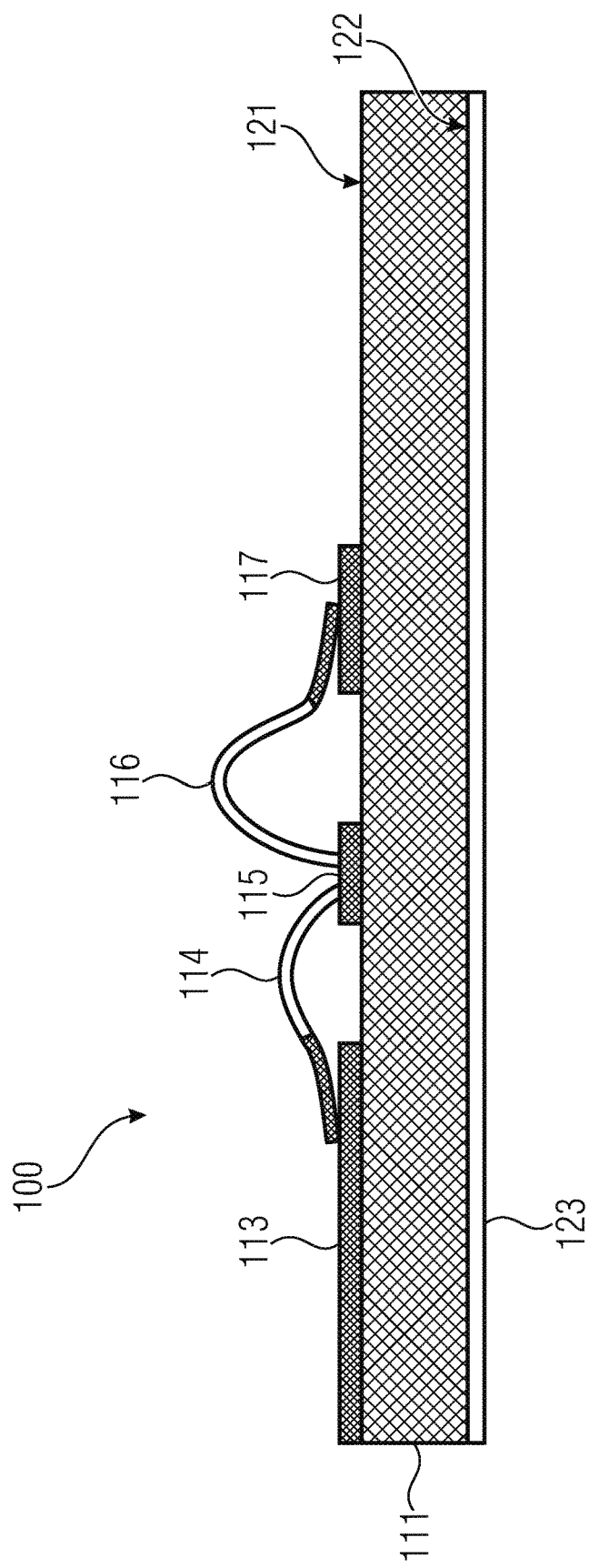
FIG. 5 shows a side view of an inventive antenna apparatus according to an embodiment.
Figure 6A:
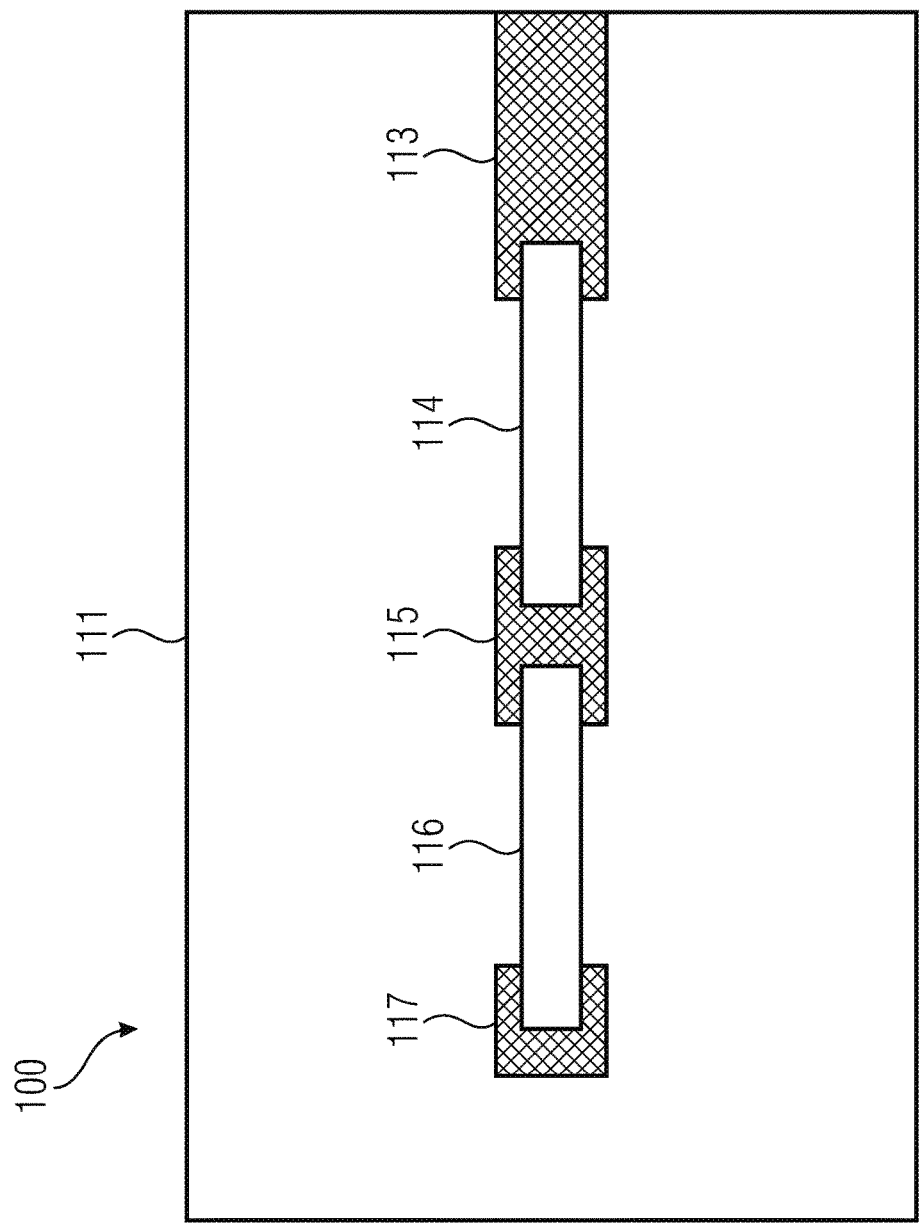
FIG. 6A shows a top view of the inventive antenna apparatus of FIG. 5.
Figure 6B:
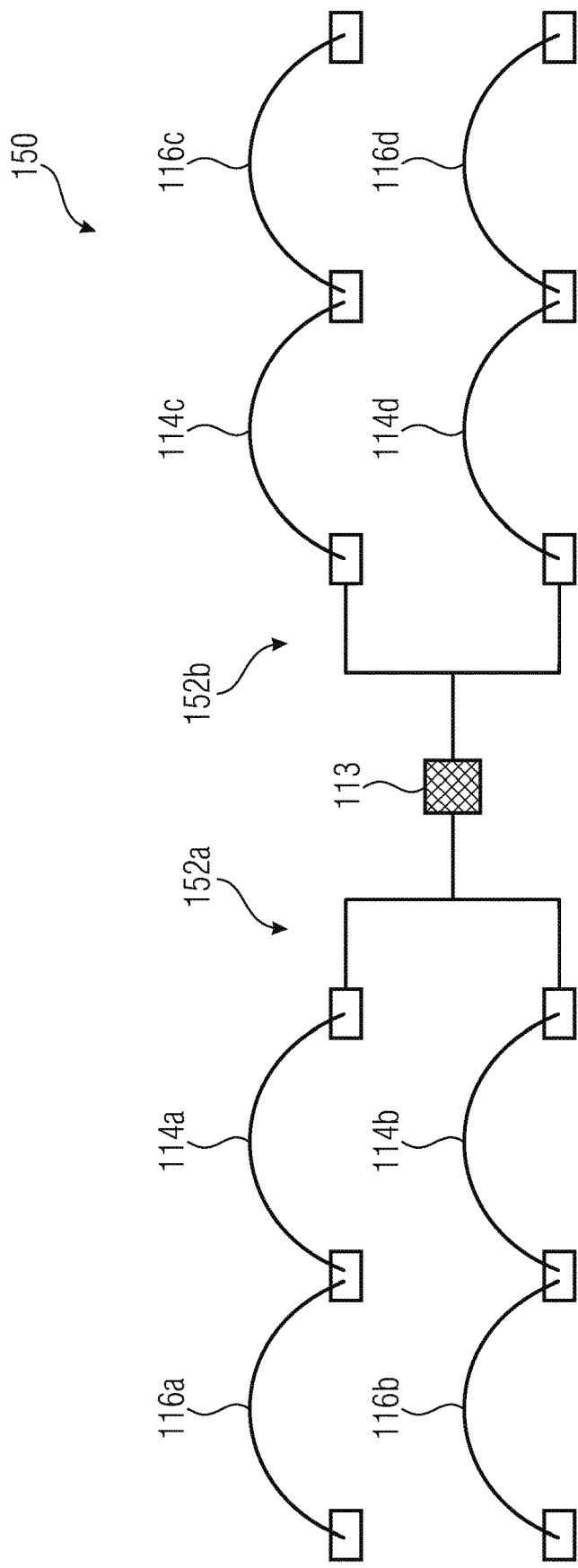
FIG. 6B shows a top view of an inventive antenna array according to an embodiment, including a plurality of antenna apparatuses according to FIG. 6A.
Figure 6C:
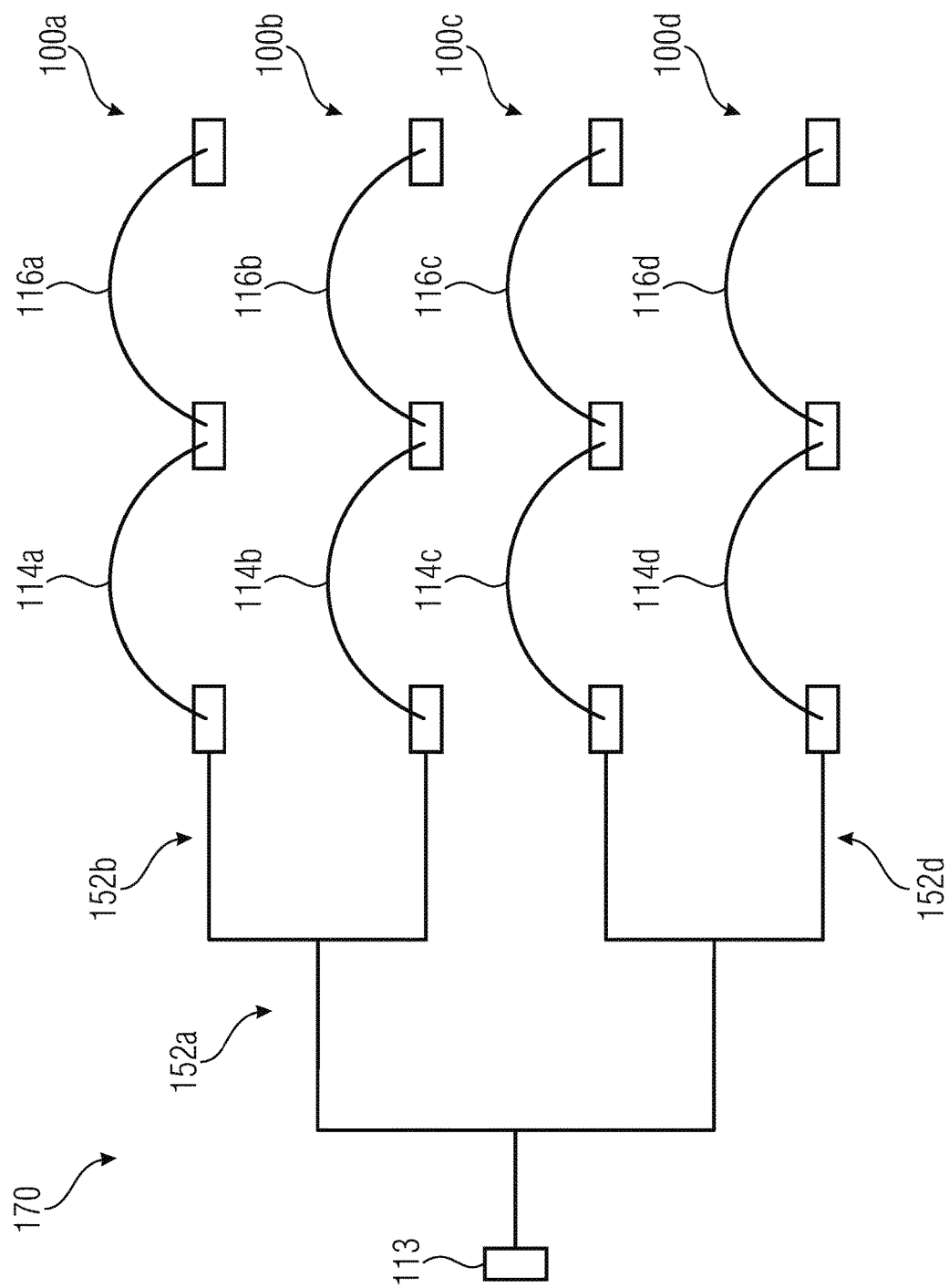
FIG. 6C shows a top view of a further inventive antenna array according to an embodiment, including a plurality of antenna apparatuses according to FIG. 6A.

FIGS. 5 and 6A show a further embodiment of an inventive antenna apparatus 100, while FIGS. 6B and 6C show embodiments of antenna arrays 150 and 170, which may be derived from the former. Among other things, the antenna apparatus 100 comprises a substrate 111 comprising a first main side 121 and a second main side 122 arranged opposite thereto.

The antenna apparatus 100 further comprises a first, a second and a third fixing region 113, 115, 117 arranged at the first main side 121 of the substrate 111 for fixing electric conductors.

The antenna apparatus 100 further comprises a first bond wire 114 connecting the first fixing region 113 and the second fixing region 115, which is at least regionally spaced apart from the substrate 111.

Furthermore, the antenna apparatus 100 comprises a second bond wire 116 connecting the second fixing region 115 and the third fixing region 117, which is at least regionally spaced apart from the substrate 111.

Furthermore, the inventive antenna apparatus 100 comprises a metallization 123 arranged at the second main side 122 of the substrate 111, which is arranged opposite to at least one of the first fixing region 113, the second fixing region 115, the third fixing region 117, the first bond wire 114 and the second bond wire 116.

The metallization 123 may extend across the entire surface of the second main side 122 of the substrate 111. Additionally, the same applies to the embodiments previously discussed with reference to FIGS. 2A, 2B, 3 and 4.

As may be seen in FIGS. 6B and 6C, a plurality or multitude of antenna apparatuses 100a, 100b, 100c, and 100d may be connected to a supply line or to the RF chip via a network of voltage dividers or power dividers 152a and 152b and 152c. For example, a leg of a first power divider 152a may be connected to a further power divider 152b and/or 152c or to an antenna apparatus. A further leg may be connected to further power dividers or to one of the antenna apparatus 10a-10d so that a total number of $2^N$ antenna apparatuses may be supplied, wherein N corresponds to a number of the stages of the network of power dividers.

Figure 7:
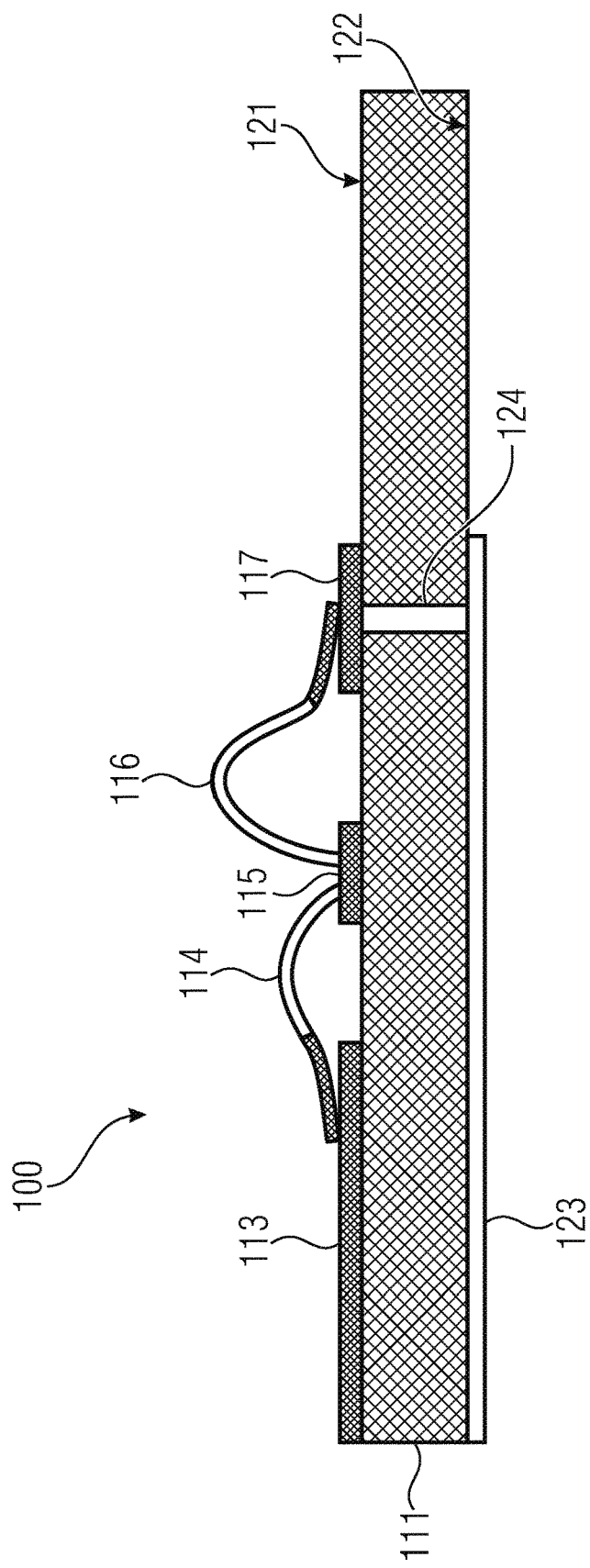
FIG. 7 shows a side view of an inventive antenna apparatus according to an embodiment.

As may be seen in FIG. 7, the metallization 123 does not have to extend across the entire surface of the second main side 122 of the substrate 111, i.e., according to the invention, the metallization 123 may also comprise discontinuations.

In the example shown in FIG. 7, the metallization 123 extends merely opposite to the first, second and third fixing region 113, 115, 117 as well as opposite to the first and second bond wires 114, 116. Other parts of the second main side 122 of the substrate 111 remain uncovered by the metallization 123. The same also applies to the embodiments discussed above with respect to FIGS. 2A, 2B, 3 and 4.

Among other things, the inventive antenna apparatuses 10, 100 are characterized in that the respective antenna apparatus 10, 100 is configured to emit a radio signal by means of the first bond wire 14, 114 and the second bond wire 16, 116 in response to an electric signal applied to the first fixing region 13, 113, wherein a wavelength range of the radio signal is affected by a sum of the length of the first bond wire 14, 114, the length of the second bond wire 16, 116 and a distance $a_{12}$ between the first bond wire 14, 114 and the second bond wire 16, 116 on the second fixing region 15, 115.

Figure 8A:
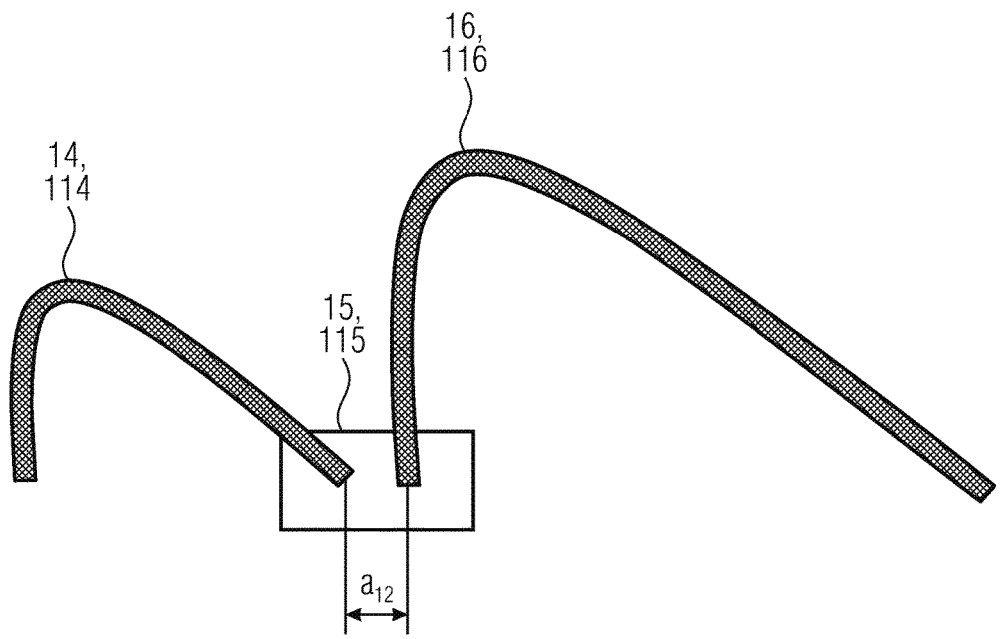
FIG. 8A shows a schematic view of a first and a second bond wire fixed at a mutual fixing region.
Figure 8B:
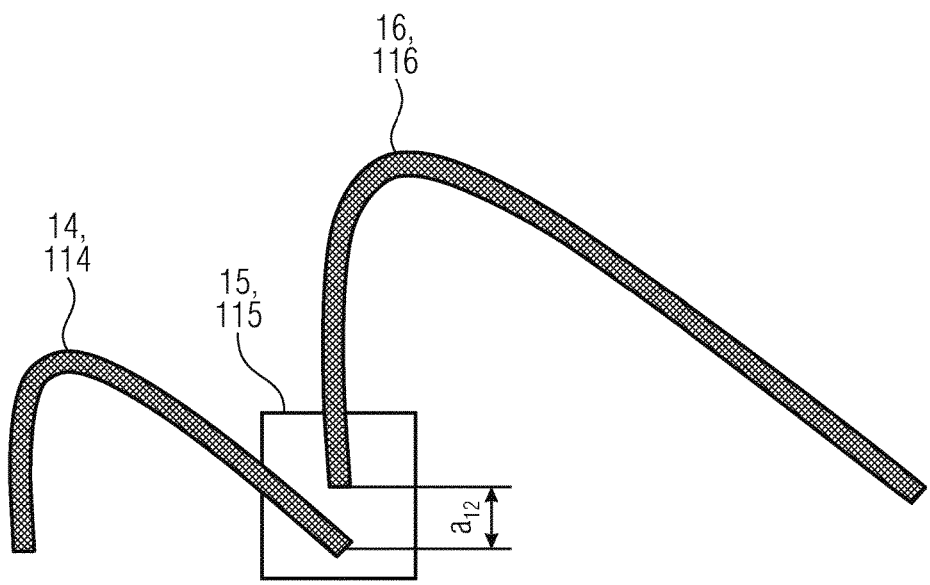
FIG. 8B shows a further schematic view of a first and a second bond wire fixed at a mutual fixing region.

This circumstance is shown in FIGS. 8A and 8B. Here, the first bond wire 14, 114, the second bond wire 16, 116 and the second fixing region 15, 115 are depicted in sections. The second fixing region 15, 115 is electrically conducting. Thus, the bond wires 14, 114; 16, 116 fixed to the second fixing portion 15, 115 form an electric series connection.

As initially mentioned, this series connection simultaneously forms a bond wire antenna by means of which a radio signal may be sent or received, wherein the wavelength of the radio signal is affected by the total length of the first bond wire 14, 114, the second bond wire 16, 116 and the distance $a_{12}$ of the two bond wires 14, 114; 16, 116 with respect to each other on the second fixing region 15, 115.

According to the invention, the lengths of the first bond wire 14, 114, the second bond wire 16, 116 and the distance $a_{12}$ between the first bond wire 14, 114 and the second bond wire 16, 116 on the second fixing region 15, 115 are selected such that the wavelength range of the radio signal to be emitted is in the microwave range or millimeter wave range, e.g., a frequency in a frequency band of at least 30 GHz and up to 300 GHz, advantageously between 30 GHz and 80 GHz and more advantageously between 60 GHz and 80 GHz. Other frequency ranges may also be realized, e.g., terahertz ranges. Millimeter waves are understood to be wavelengths in a range of at least 1 mm and up to 10 mm, which correspond to a frequency of the electric signal via the correlation $\lambda = c/f$.

For example, an implementation of the length L of the bond wire antenna 14, 114; 16, 116; $a_{12}$ may be carried out in a correlation of $L = \lambda/8, \lambda/4, \lambda/2, \lambda, 2\lambda, 4\lambda$ or the like, wherein A is a wavelength of the radio signal. Advantageously, the antenna apparatus 10 is implemented as $\lambda/2$ radiator or as $\lambda/4$ radiator. With respect to the correlation between the wavelength A and the total length $L_{101}$, a tolerance range of up to 70%, up to 50% or up to 30% may be applied. In particular in millimeter wavelengths range, an exact implementation of the length L of the bond wire antenna with respect to a frequency band of the radio signal to be provided by the antenna apparatus 10, 100 may be advantageous so that a tolerance region of up to 30%, up to 20% or up to 10% may be applicable.

In general, in the inventive antenna apparatus 10, 100, the length of the first bond wire 14, 114 may be shorter than the length of the second bond wire 16, 116. Thus, e.g., the RF chip 12 (FIGS. 2A, 2B, 3 and 4) may be connected to the substrate 11, 111 with a first bond wire 14, 114 which is as short as possible, while the resulting bond wire antenna 14, 114; 16, 116 may be adjusted in a simple manner by means of a variation of the length of the second bond wire 16, 116.

As exemplarily shown in FIGS. 5, 6A and 7, the first fixing region 113 may be implemented as a strip line, wherein a wavelength range of a radio signal emitted by means of the first bond wire 114, the second bond wire 116 and the strip line 113 is affected by a sum of the individual lengths of the first bond wire 114 and the second bond wire 116 and the strip line 113. As mentioned above, in addition, the distance $a_{12}$ of the two bond wires 114, 116 with respect to each other on the second fixing region 115 may additionally affect the wavelength of the radio signal.

The strip line 113 may serve for a signal supply of the first bond wire 114, the second bond wire 116 and the second fixing region 115 connecting the two bond wires 114, 116.

In some embodiments of the invention, the second fixing region 15, 115 and the third fixing region 17, 117 are bond pads arranged on the substrate 11, 111, which are spatially spaced apart from each other and galvanically separated from each other.

In the following, with reference to FIGS. 3, 5 and 7, the metallization 23, 123 is described again. In principle, the metallization 23, 123 arranged on the first main side 22, 122 of the substrate 11, 111 may be galvanically separated with respect to the structures arranged on the first main side 21, 121 of the substrate 11, 111 (i.e., first fixing region 13, 113, second fixing region 15, 115, third fixing region 17, 117, first bond wire 14, 114, second bond wire 16, 116). This means that there is no electrically conducting direct connection between the metallization 23, 123 and the structures arranged on the first main side 21, 121.

In further embodiments, the third fixing region 17, 117 arranged on the first main side 21, 121 of the substrate 11, 111, and the metallization 23, 123 arranged at the second main side 22, 122 of the substrate 11, 111 may be connected by means of an electrically conductive structure 124 extending through the substrate 11, 111. For example, this electrically conductive structure 123 may be so-called vias.

Alternatively or additionally, these vias 124 may also connect in an electrically conducting manner the metallization 23, 123 and the first fixing region 13, 113 and/or the second fixing region 15, 115.

It turned out to be advantageous when the vias 124 galvanically connect the metallization 23, 123 to the fixing region terminating the bond wire antenna. Usually, this is the third fixing region 17, 117.

In the embodiments with electrically conducting vias 124, a wavelength range of an emitted radio signal is affected by the sum of the individual lengths of the first and second bond wires 14, 114; 16, 116 and the electrically conductive structure 124 extending through the substrate 11, 111.

Irrespective of whether or not the antenna structure 10, 100 comprises a via 124, the metallization 23, 123 arranged at the second main side 22, 122 of the substrate 11, 111 may be a reflector for a radio signal emitted by means of the first bond wire 14, 114 and the second bond wire 16, 116. With this, a good shielding of the second main side 22, 122 of the substrate 11, 111 may be achieved.

Alternative to a metallization 23, 123 implemented to be flat and to be a reflector, it is also possible to implement the metallization 23, 123 in a discontinuous manner across the second main side 22, 122 of the substrate 11, 111. Thus, discontinuing structures such as recesses may be used to implement antenna structures. Thus, a slot-shaped recess in the metallization 23, 123 may be used to form a slot antenna so that the radio signal also radiates in a direction of the substrate 11, 111, which is facing away from the bond wires 14, 114; 16, 116.

In other words, the first fixing region 113 may be referred to as coplanar feed line. The metallization 23, 123 may be used as a reflector or reference potential (ground plane). The third fixing region 117 may be used a return line of the feed current flowing through the two bond wires 114, 116.

A three-dimensional radiation of the radio signal may be achieved by at least regionally spacing apart the two bond wires 114, 116 from the substrate 111.

Figure 9:
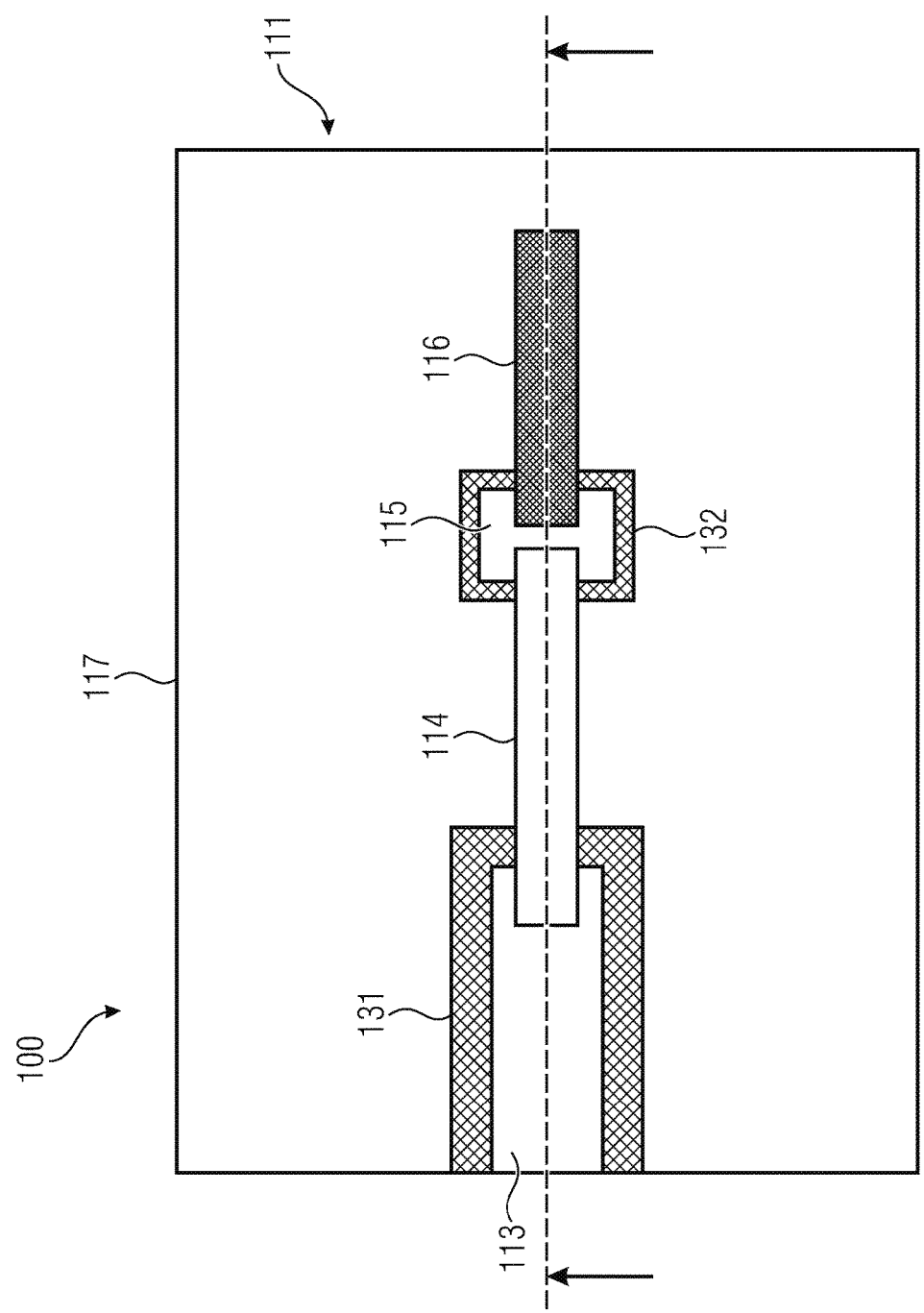
FIG. 9 shows a top view of an inventive antenna apparatus according to an embodiment.
Figure 10:
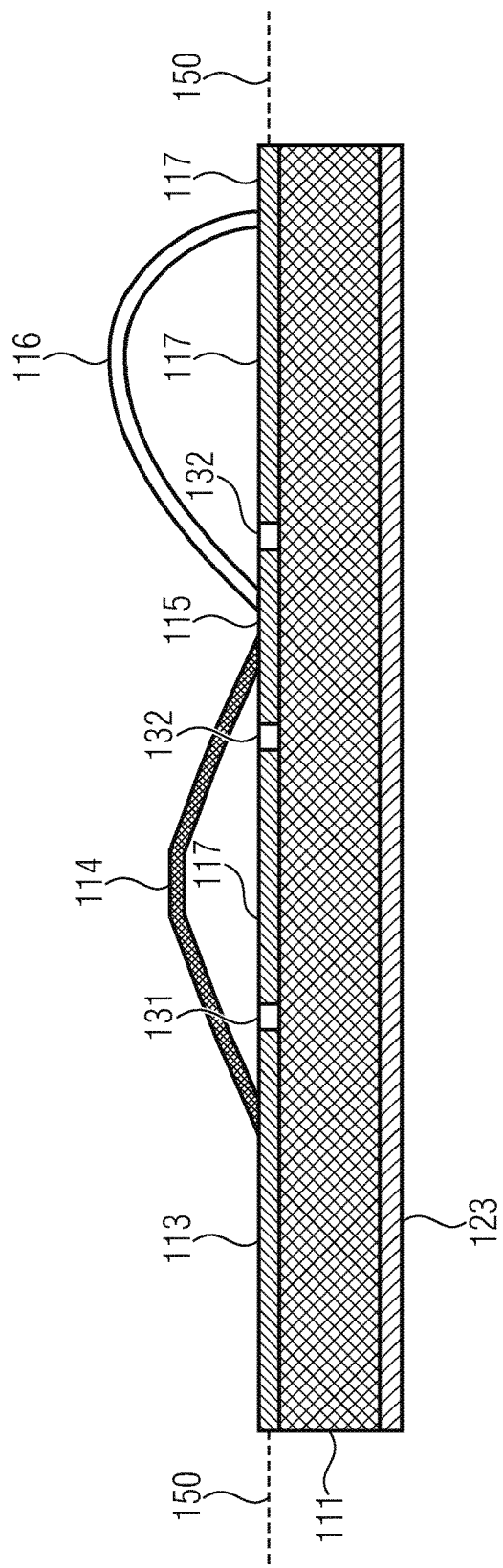
FIG. 10 shows a side view of the antenna apparatus of FIG. 9.

FIGS. 9 and 10 show a further embodiment of an inventive antenna apparatus 100. Here, the first, the second and the third fixing region 113, 115, 117 are all located in the same substrate plane 150. Furthermore, the third fixing region 117 surrounds the first fixing region 113 and/or the second fixing region 115 at least in portions in this plane 150 so that the first fixing region 113 configures a coplanar supply line, or feed line, with respect to the second fixing region 115 and/or with respect to the third fixing region 117. This enables a low extent of parasitic radiations, a good noise radiation property and a high extent of electromagnetic compatibility (EMC).

Here, in other words, the third fixing region 117 covers a large part of the surface of the first main side 121 of the substrate 111. The third fixing region 117 surrounds the first fixing region 113 and the second fixing region 115 at least in portions. The individual fixing regions 113, 115, 117 are galvanically separated from each other.

A first galvanic separation structure 131 is provided between the first fixing region 113 and the third fixing region 117. A second galvanic separation structure 132 is provided between the second fixing region 115 and the third fixing region 117. For example, the separation structures 131, 132 may be configured in the form of perforations in the third fixing region 117. It would also be conceivable that corresponding trenches 131, 132 are etched into the third fixing region 117 using an etching method.

The fixing regions 113, 115, 117 consist of a conductive material. For example, the fixing regions 113, 115, 117 may comprise one or several metals. Additionally, a metallization 123 may be arranged on the second main side 122 of the substrate 111.

Figure 11:
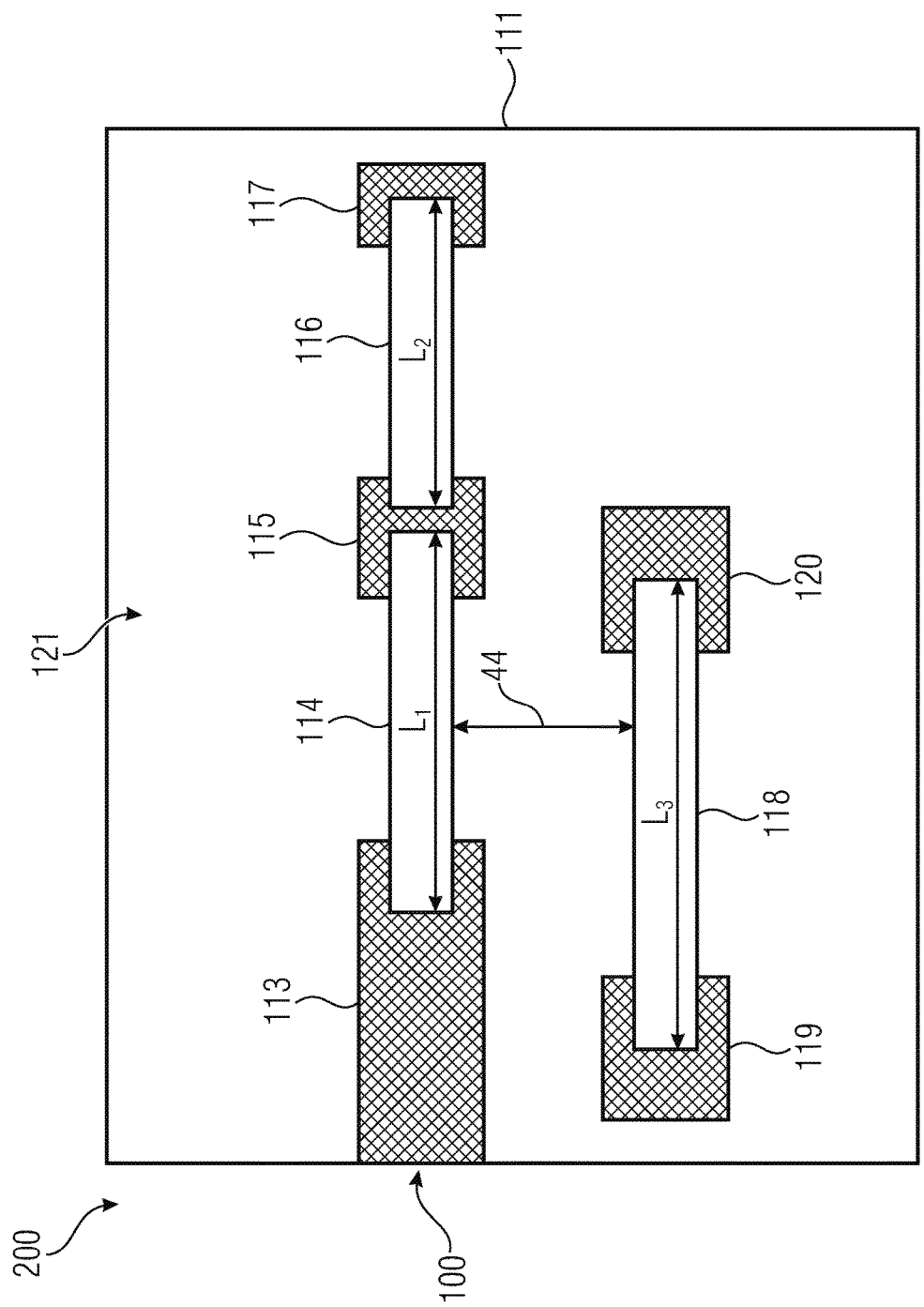
FIG. 11 shows a top view of an inventive antenna array according to an embodiment.

FIG. 11 shows a further embodiment of the invention. This embodiment is an antenna array 200 which may be structured together with the above-described antenna structure 100. The antenna array 200 may either be structured with the antenna apparatus 10 previously discussed with reference to FIGS. 2A, 2B, 3 and 4 or with the antenna apparatus 100 previously discussed with reference to FIGS. 5 to 10.

Besides at least one antenna apparatus 10, 100, the antenna array 200 comprises at least one third electric conductor 118. The third electric conductor 118 may be a conductor tape, a conductor path integrated into the substrate 111 or a bond wire.

In the embodiment depicted in FIG. 11, the electric conductor is a third bond wire 118. This third bond wire 118 mechanically and galvanically connects a fourth fixing region 119 and a fifth fixing region 120 arranged on the first main side 121 of the substrate 111.

The fourth fixing region 119 and the fifth fixing region 120 are each galvanically separated from the first, second and third fixing regions 113, 115, 117, i.e., there is no direct electrically conducting connection between the fourth and fifth fixing regions 119, 120 to one of the first, second and third fixing regions 113, 115, 117.

In other words, the antenna apparatus 10, 100 is spatially and galvanically separated from the fourth fixing region 119, the fifth fixing region 120 and the third bond wire 118. However, the antenna apparatus 10, 100 may be electromagnetically coupled at least to the third bond wire 118.

In this case, the antenna apparatus 10, 100 and the third bond wire 118 may be arranged with respect to each other such that the third bond wire 118 functions as a reflector or as a director with respect to the antenna apparatus 10, 100.

In other words, the antenna array 200 may comprise one of the two antenna apparatuses 10, 100 with at least one first and one second bond wire 14, 114; 16, 116 and the three fixing regions 13, 113; 15, 115; 17; 117 and additionally at least one third bond wire 118 galvanically connecting a fourth and a fifth fixing region 119, 120. The fourth and fifth fixing regions 119, 120 and the third bond wire 118 are electrically or galvanically separated from the two bond wires 14, 114, 16, 116 of the antenna apparatus 10, 100 of the antenna array 200. The third bond wire 118 may have a length $L_3$ which is different from the length $L_1$ of the first bond wire 114 and/or from the length $L_2$ of the second bond wire 116 and/or from a sum of the lengths $L_1$, $L_2$ and the expansion $a_{12}$ of the second fixing region 15, 115. Furthermore, the third bond wire 118 may be arranged with a distance 44 and approximately in parallel to the first and/or the second bond wire 114, 116. This enables the third bond wire 118 to act as a director or reflector, e.g., as is known from so-called Yagi-Uda configurations, which include a driver element for generating the radio signal and at least one reflector element and at least one director element. This means that the third bond wire 118 may function as a reflector antenna or a director antenna by interacting with at least one of the bond wires. Alternatively, the third bond wire 118 may also be arranged in another configuration as a passive radiator, wherein the distance 44, the length $L_3$ and/or an orientation of the third bond wire 118 with respect to the first and/or the second bond wire 114, 116 are variable.

Thus, almost any number of antenna arrays 200 may be provided with an antenna apparatus 10, 100 according to the invention. For example, using the inventive antenna apparatus 10, 100 in combination with at least one further electric conductor 118, as described above, several antenna array structures may be provided.

Figure 12A:
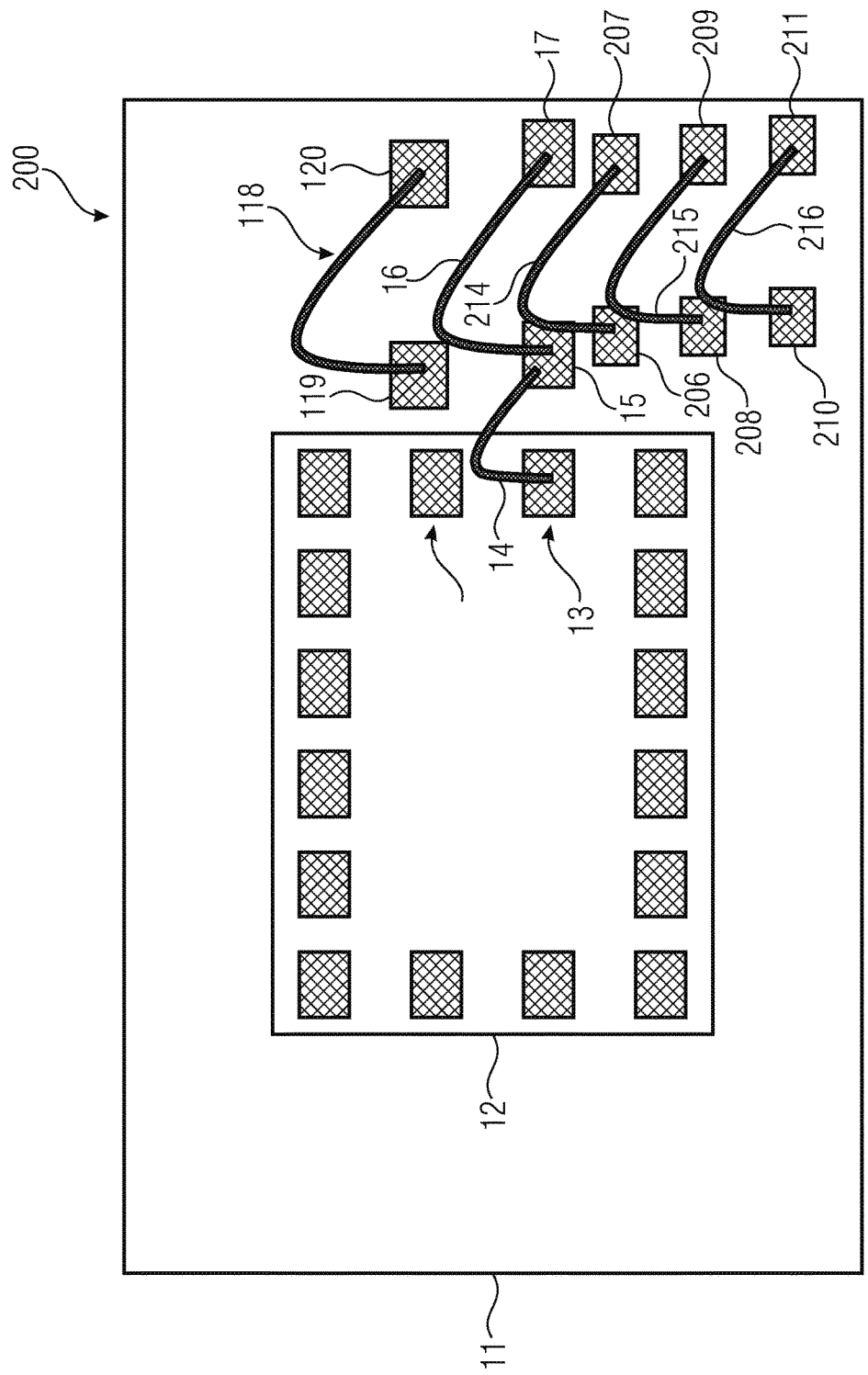
FIG. 12A shows a top view of a further inventive antenna array according to an embodiment.

For example, FIG. 12A shows an antenna array 200 according to the invention having an antenna apparatus 10 comprising a RF chip 12 arranged on a substrate 11 and several bond wires. By means of several bond wires, this embodiment forms a Yagi-Uda antenna.

The RF chip 12 comprises a first antenna port 13 simultaneously serving as a first fixing region 13 for the first bond wire 14. The bond wire 14 extends from the first fixing region 13 to a second fixing region 15 arranged on the substrate 11.

A second bond wire 16 connects the second fixing region 15 to a third fixing region 17 arranged on substrate 11. This results in a series connection of the first and second bond wires 14, 16, which together function as a linear radiator and/or monopole antenna.

Furthermore, a third bond wire 118 connecting a fourth and a fifth fixing region 119, 120 is arranged on the substrate 11. In this case, the third bond wire 118 functions as a reflector for the radio signal emitted by means of the first and second bond wires 14, 16.

Furthermore, at least one fourth bond wire 214 connecting a sixth fixing region 206 arranged on substrate 11 and a seventh fixing region 207 arranged on the substrate 11 is arranged on the substrate 11.

In this case, the fourth bond wire 214 functions as a director for the radio signal emitted by means of the first and second bond wires 14, 16.

Furthermore, a fifth bond wire 215 connecting an eighth fixing region 208 arranged on the substrate 11 and a ninth fixing region 209 arranged on the substrate 11 is arranged on the substrate 11.

In this case, the fifth bond wire 215 functions as a further director for the radio signal emitted by means of the first and second bond wires 14, 16.

Furthermore, a sixth bond wire 216 connecting a tenth fixing region 210 arranged on the substrate 11 and an eleventh fixing region 211 arranged on the substrate 11 is arranged on the substrate 11.

The sixth bond wire 216 also acts as a further director for the radio signal emitted by means of the first and second bond wires 14, 16.

Figure 12B:
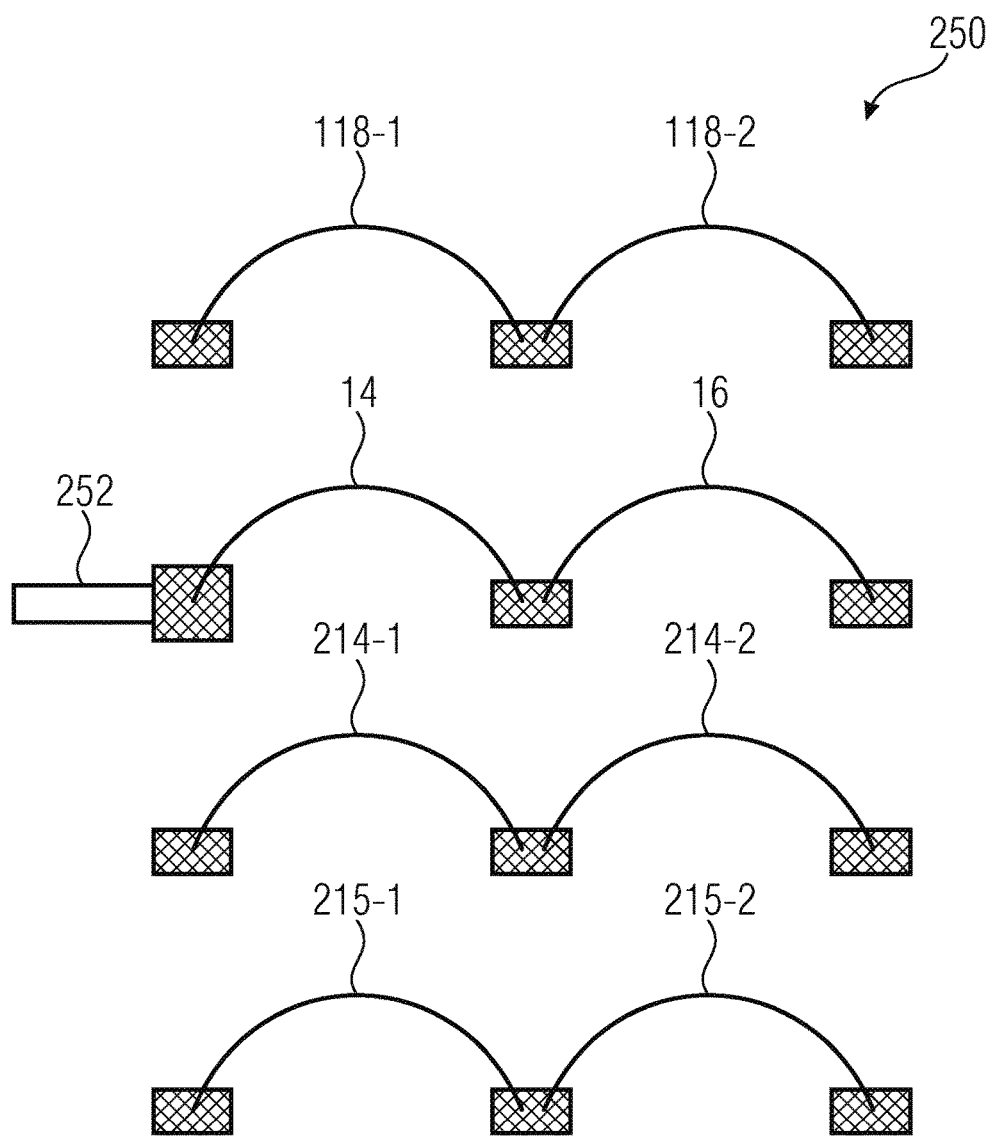
FIG. 12B shows a top view of a further inventive antenna array according to an embodiment, implemented as a Yagi-Uda antenna.

As is shown for an antenna apparatus 250 based on FIG. 12B, each of the bond wires 118, 214, 215 and/or 216 may be realized as a series connection of at least two bond wires. Thus, a series connection of bond wires 118-1 and 118-2 may be used as a reflector element. A series connection of bond wires 214-1 and 214-2 and/or a series connection of bond wires 215-1 and 215-2 may be used as a director element. The driver element including the bond wires 14 and 16 may be connected via a lead 252 to the RF chip 12. Alternatively, the bond wire 14 may also be directly connected to the RF chip 12.

Figure 13A:
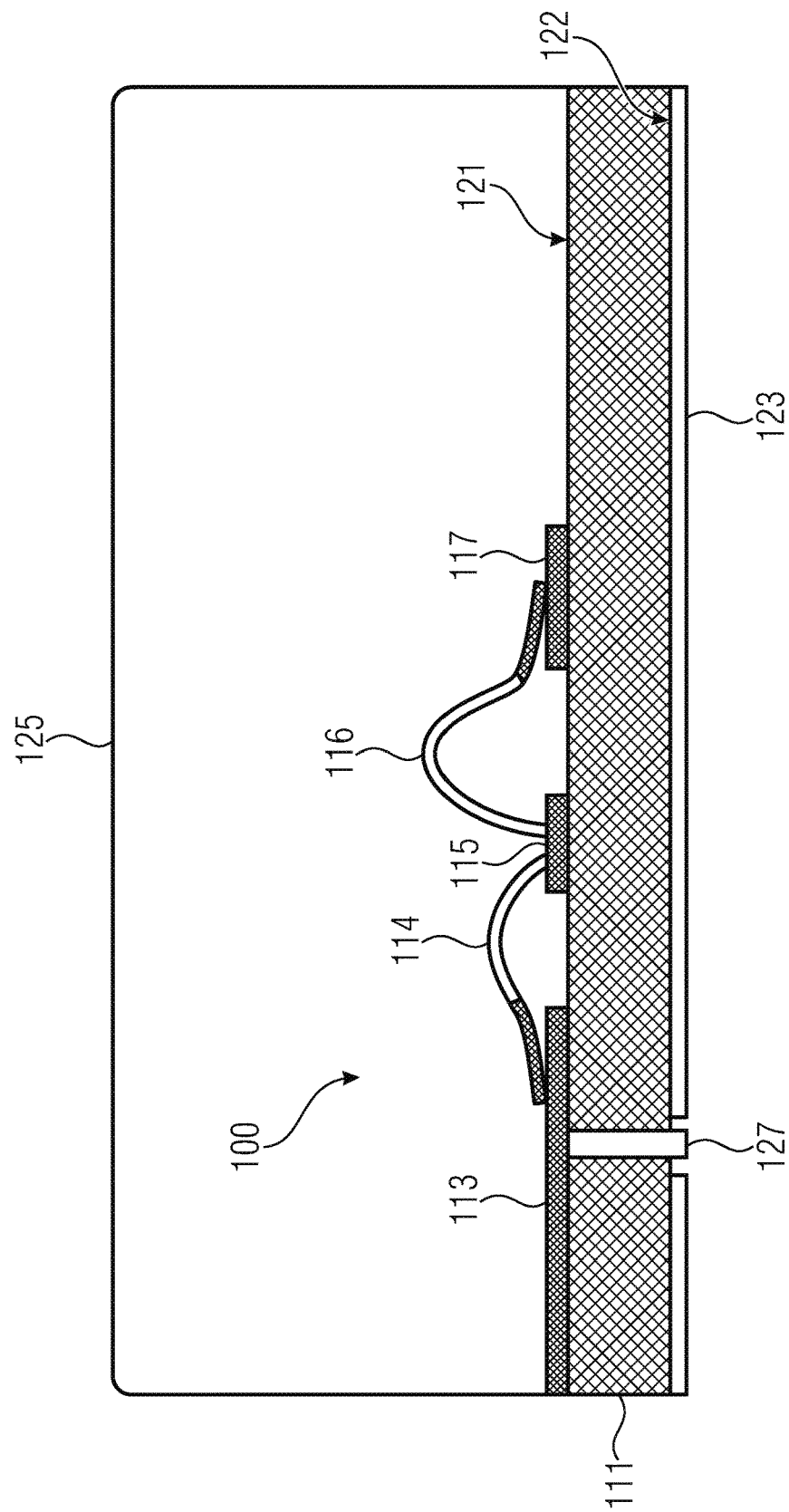
FIG. 13A shows a schematic side sectional view of an inventive antenna apparatus including a housing.

As is depicted in FIG. 13A, an antenna apparatus according to the invention or an antenna array according to the invention may include a housing 125. Although the antenna apparatus 100 is depicted, alternatively or additionally, any other antenna apparatus according to embodiments, any antenna array according to embodiments and/or a combination thereof may be arranged inside of the housing 125. The housing 125 is formed at least regionally including a dielectric or electrically insulating material in order to enable an exit of the radio signal out of the housing 125. For example, the housing 125 may include plastic material or glass material. Plastic material may be arranged during a dicing or encapsulation of the antenna apparatus 100 out of a wafer. An interior volume of the housing 125 may at least be partially filled with a gas such as air, or a material having a low dielectric constant, or a material leading to a low performance loss. The metallization 123 may be connected to a wall of the housing 125 or may form the wall in order to enable in a simple manner a contacting of the metallization to other components. Furthermore, the housing 125 may comprise a terminal 127 connected to an electrically conductive structure, e.g., implemented as a via, in order to enable an excitation of the antenna apparatus 100. The terminal 127 may serve for providing a vertical connection to the antenna apparatus 100, e.g., at the fixing region 113 and/or by a connection to a RF chip, in order to excite the antenna apparatus 100. Thus, the terminal 127 may provide a contact to the surrounding area of the antenna apparatus 100.

Figure 13B:
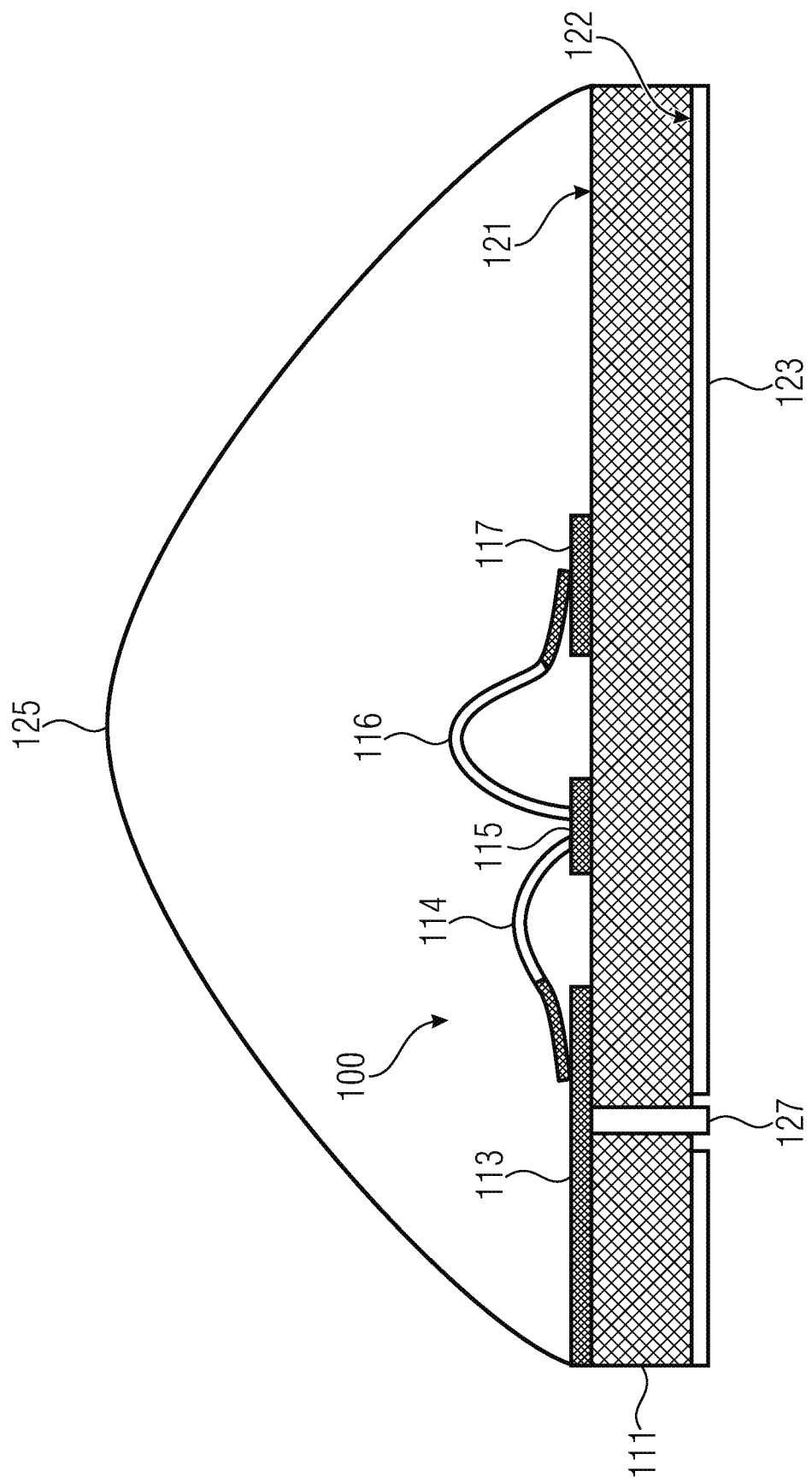
FIG. 13B shows a schematic side sectional view of an inventive antenna apparatus, wherein the housing forms a lens.

FIG. 13B shows a schematic side sectional view of the antenna apparatus 100 according to an embodiment, wherein, compared to FIG. 13A, the housing 125 is implemented as a lens configured to affect a radiation characteristic of the radio signal which may be generated with the antenna apparatus. For example, the lens may be configured to concentrate the radio signal. For example, the interior of the housing 125 may at least be partially filled with a dielectric material, and an outer shape of the housing 125 may comprise a concave or convex shape in order to obtain a diffusing or concentrating function of the lens. This means that the housing 125 may form a lens which is configured to concentrate or to diffuse a radio signal generated by the antenna apparatus.

In the following, the invention shall be summarized in other words.

At higher frequencies (e.g., in the millimeter wavelength range and higher) known planar antennas such as patch antennas, dipoles, monopoles, etc. sometimes comprise losses in correlation with the dielectric which is used for manufacturing the antenna. Dielectric and losses and surface wave losses are examples for this.

Furthermore, at such high frequencies, the connection between the RF chip and an antenna on an interposer or a board may lead to signal integrity problems weakening the system performance.

In order to solve this problem, bond wire antennas are provided. They serve as a connection for linking the RF chip and, at the same time, as an antenna. They solve the challenges connected to dielectric losses of conventional planar antennas and they eliminate the necessity for an additional antenna on the interposer or the board.

In order to counteract at high frequencies, e.g., in applications in the millimeter wavelength range and above, the high attenuation of free space associated therewith, suitable antenna structure (e.g., arrays) are needed.

However, due to the present design, known bond wire antennas do not allow the direct connection of an array to the chip or the chip carrier.

However, the present invention proposes bond wire antennas which solve all of the problems stated. The bond wire antenna according to the invention comprises at least two wires which are bonded into a series connection. The first wire connects the antenna pad on the chip to the interposer or the chip carrier. The second wire extends the electric length of the inventive bond wire antenna on the interposer of the chip carrier, e.g., as shown in FIG. 12A.

The simple implementation of a multiwire bond wire antenna may be used, e.g., in order to provide a multitude of different bond wire antenna configurations. When designing multiwire bond wire antennas it should be noted that the resonance length is determined by the length of both wires and the short connection path between the wired tips of the two wires.

For example, the inventive antenna apparatus may be fed by a planar feed line (e.g., microstrip, coplanar), an electromagnetic coupling (e.g., aperture feed or proximity feed) or a vertical probe feed, e.g., by means of a via.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An antenna apparatus comprising:
a radio-frequency chip arranged on a substrate, wherein the radio-frequency chip comprises at least one antenna output terminal, wherein the antenna output terminal functions as a first fixing region for an electric conductor,
at least one first bond wire connecting in an electrically conducting manner the first fixing region to a second fixing region arranged on the substrate,
at least one second bond wire connecting in an electrically conducting manner the second fixing region and a third fixing region arranged on the substrate,
wherein the first and the second bond wire electrically connected in series form an antenna, and
wherein the first and the second bond wire are at least regionally spaced apart from the substrate.

2. The antenna apparatus according to claim 1, wherein the radio-frequency chip is arranged on a first main side of the substrate, and wherein a metallization is arranged at the substrate on a second main side of the substrate opposite to the first main side.

3. The antenna apparatus according to claim 1, wherein the substrate comprises on the first main side a recess extending in a direction of the second main side, and the radio-frequency chip is arranged in this recess.

4. The antenna apparatus according to claim 3, wherein the depth of the recess corresponds to the thickness of the radio-frequency chip so that the top side of the radio-frequency chip is coplanar to the first main side of the substrate when the radio-frequency chip is arranged in this recess.

5. The antenna apparatus according to claim 1, wherein the first, the second and the third fixing region are located in the same substrate plane, and the third fixing region surrounds the first fixing region and/or the second fixing region in this plane at least in portions so that the third fixing region configures a coplanar supply line with respect to the second fixing region and/or with respect to the first fixing region.

6. The antenna apparatus according to claim 1, wherein the antenna apparatus is configured to emit a radio signal by means of the first bond wire and the second bond wire in response to an electric signal applied to the first fixing region, wherein a wavelength range of the radio signal is affected by a sum of the length of the first bond wire, the length of the second bond wire and a distance between the first and the second bond wire on the second fixing region.

7. The antenna apparatus according to claim 6, wherein the lengths of the first bond wire and the second bond wire are selected together with the distance between the first bond wire and the second bond wire on the second fixing region such that the wavelength range of the radio signal to be emitted is in the microwave range, the millimeter range or the terahertz range.

8. The antenna apparatus according to claim 1, wherein the first fixing region is implemented as a strip line, wherein a wavelength range of a radio signal emitted by means of the first bond wire, the second bond wire and the strip line is affected by a sum of the individual lengths of the first bond wire and the second bond wire and the strip line.

9. The antenna apparatus according to claim 1, wherein the length of the first bond wire is shorter than the length of the second bond wire.

10. The antenna apparatus according to claim 1, wherein the second fixing region and the third fixing region are bond paths arranged on the substrate, which are spatially spaced apart from each other and galvanically separated from each other.

11. The antenna apparatus according to claim 2, wherein the metallization comprises discontinuations.

12. The antenna apparatus according to claim 2, wherein the metallization arranged at the second main side of the substrate is a reflector for a radio signal emitted by means of the first bond wire and the second bond wire.

13. The antenna apparatus according to claim 2, wherein the third fixing region arranged on the first main side of the substrate and the metallization arranged at the second main side of the substrate are connected by means of an electrically conductive structure extending through the substrate.

14. The antenna apparatus according to claim 13, wherein a wavelength range of an emitted radio signal is affected by the sum of the individual lengths of the first and the second bond wire and the electrically conductive structure extending through the substrate.

15. The antenna apparatus according to claim 1, further comprising a housing in which the antenna apparatus is arranged and which comprises a terminal for connecting the antenna apparatus to a radio-frequency chip.

16. The antenna apparatus according to claim 15, wherein the housing forms a lens configured to concentrate or to diffuse a radio signal generated by the antenna apparatus.

17. An antenna array with at least one antenna apparatus according to claim 1, comprising at least one third bond wire connecting a fourth and a fifth fixing region arranged on the first main side of the substrate, and further comprising at least one fourth bond wire connecting a sixth and a seventh fixing region arranged on the first main side of the substrate.

18. The antenna array according to claim 17, wherein the antenna apparatus is spatially and galvanically separated from the fourth fixing region, the fifth fixing region, the sixth fixing region, the seventh fixing region, the third bond wire and the fourth wire bond, and wherein the antenna apparatus, the third bond wire and the fourth bond wire are arranged with respect to each other such that the third bond wire acts as a reflector with respect to the antenna apparatus and a fourth bond wire acts as a reflector.

19. The antenna array according to claim 17, further comprising a housing in which the antenna apparatus is arranged and which comprises a terminal for connecting the antenna apparatus to a radio-frequency chip.

20. The antenna array according to claim 19, wherein the housing forms a lens configured to concentrate or to diffuse a radio signal generated by the antenna apparatus.

21. An antenna apparatus comprising:
  a substrate comprising a first main side and a second main side arranged opposite thereto;
  a first, a second and a third fixing region arranged at the first main side for fixing electric conductors;
  at least one first bond wire connecting the first fixing region and the second fixing region, which is at least regionally spaced apart from the substrate;
  at least one second bond wire connecting the second fixing region and the third fixing region, which is at least regionally spaced apart from the substrate; and
  a metallization arranged at the second main side of the substrate, which is arranged opposite to at least one of the first fixing region, the second fixing region, the third fixing region, the first bond wire and the second bond wire;
  wherein the antenna apparatus is configured to emit a radio signal by means of the first bond wire and the second bond wire in response to an electric signal applied to the first fixing region, wherein a wavelength range of the radio signal is affected by a sum of the length of the first bond wire, the length of the second bond wire and a distance between the first and the second bond wire on the second fixing region.

22. The antenna apparatus according to claim 21, wherein the first, the second and the third fixing region are located in the same substrate plane, and the third fixing region surrounds the first fixing region and/or the second fixing region in this plane at least in portions so that the third fixing region configures a coplanar supply line with respect to the second fixing region and/or with respect to the first fixing region.

23. The antenna apparatus according to claim 21, wherein the lengths of the first bond wire and the second bond wire are selected together with the distance between the first bond wire and the second bond wire on the second fixing region such that the wavelength range of the radio signal to be emitted is in the microwave range, the millimeter range or the terahertz range.

24. The antenna apparatus according to claim 21, wherein the first fixing region is implemented as a strip line, wherein a wavelength range of a radio signal emitted by means of the first bond wire, the second bond wire and the strip line is affected by a sum of the individual lengths of the first bond wire and the second bond wire and the strip line.

25. The antenna apparatus according to claim 21, wherein the length of the first bond wire is shorter than the length of the second bond wire.

26. The antenna apparatus according to claim 21, wherein the second fixing region and the third fixing region are bond paths arranged on the substrate, which are spatially spaced apart from each other and galvanically separated from each other.

27. The antenna apparatus according to claim 21, wherein the metallization comprises discontinuations.

28. The antenna apparatus according to claim 21, wherein the metallization arranged at the second main side of the substrate is a reflector for a radio signal emitted by means of the first bond wire and the second bond wire.

29. The antenna apparatus according to claim 21, wherein the third fixing region arranged on the first main side of the substrate and the metallization arranged at the second main side of the substrate are connected by means of an electrically conductive structure extending through the substrate.

30. The antenna apparatus according to claim 29, wherein a wavelength range of an emitted radio signal is affected by the sum of the individual lengths of the first and the second bond wire and the electrically conductive structure extending through the substrate.

31. The antenna apparatus according to claim 21, further comprising a housing in which the antenna apparatus is arranged and which comprises a terminal for connecting the antenna apparatus to a radio-frequency chip.

32. The antenna apparatus according to claim 31, wherein the housing forms a lens configured to concentrate or to diffuse a radio signal generated by the antenna apparatus.

33. An antenna array with at least one antenna apparatus comprising:
a substrate comprising a first main side and a second main side arranged opposite thereto;
a first, a second and a third fixing region arranged at the first main side for fixing electric conductors;
at least one first bond wire connecting the first fixing region and the second fixing region, which is at least regionally spaced apart from the substrate;
at least one second bond wire connecting the second fixing region and the third fixing region, which is at least regionally spaced apart from the substrate; and
a metallization arranged at the second main side of the substrate, which is arranged opposite to at least one of the first fixing region, the second fixing region, the third fixing region, the first bond wire and the second bond wire;
wherein the antenna array comprises at least one third bond wire connecting a fourth and a fifth fixing region arranged on the first main side of the substrate, and further comprising at least one fourth bond wire connecting a sixth and a seventh fixing region arranged on the first main side of the substrate.

34. The antenna array according to claim 33, wherein the antenna apparatus is spatially and galvanically separated from the fourth fixing region, the fifth fixing region, the sixth fixing region, the seventh fixing region, the third bond wire and the fourth wire bond, and wherein the antenna apparatus, the third bond wire and the fourth bond wire are arranged with respect to each other such that the third bond wire acts as a reflector with respect to the antenna apparatus and a fourth bond wire acts as a reflector.

35. The antenna array according to claim 33, further comprising a housing in which the antenna apparatus is arranged and which comprises a terminal for connecting the antenna apparatus to a radio-frequency chip.

36. The antenna array according to claim 35, wherein the housing forms a lens configured to concentrate or to diffuse a radio signal generated by the antenna apparatus.

* * * * *